US009947724B2

(12) United States Patent
Hersam et al.

(10) Patent No.: US 9,947,724 B2
(45) Date of Patent: Apr. 17, 2018

(54) ULTRALOW POWER CARBON NANOTUBE LOGIC CIRCUITS AND METHOD OF MAKING SAME

(71) Applicants: NORTHWESTERN UNIVERSITY, Evanston, IL (US); REGENTS OF THE UNIVERSITY OF MINNESOTA, Minneapolis, MN (US)

(72) Inventors: Mark C. Hersam, Wilmette, IL (US); Michael L. Geier, Chicago, IL (US); Pradyumna L. Prabhumirashi, Chicago, IL (US); Weichao Xu, Minneapolis, MN (US); Hyungil Kim, Woodbury, MN (US)

(73) Assignees: NORTHWESTERN UNIVERSITY, Evanston, IL (US); REGENTS OF THE UNIVERSITY OF MINNESOTA, Minneapolis, MN (US)

( * ) Notice: Subject to any disclaimer, the term of this patent is extended or adjusted under 35 U.S.C. 154(b) by 0 days.

(21) Appl. No.: 15/437,060

(22) Filed: Feb. 20, 2017

(65) Prior Publication Data
US 2017/0162628 A1 Jun. 8, 2017

Related U.S. Application Data

(62) Division of application No. 14/511,705, filed on Oct. 10, 2014, now Pat. No. 9,613,879.
(Continued)

(51) Int. Cl.
*H01L 27/28* (2006.01)
*H01L 51/05* (2006.01)
(Continued)

(52) U.S. Cl.
CPC ........ *H01L 27/283* (2013.01); *H01L 51/0007* (2013.01); *H01L 51/0017* (2013.01);
(Continued)

(58) Field of Classification Search
CPC ............... H01L 27/283; H01L 51/0007; H01L 51/0026; H01L 51/0017; H01L 51/0545;
(Continued)

(56) References Cited

U.S. PATENT DOCUMENTS

| 4,663,646 A * | 5/1987 | Ikawa ....................... G11C 5/02 257/204 |
| 2008/0227250 A1* | 9/2008 | Ranade ............. H01L 21/76897 438/203 |

(Continued)

OTHER PUBLICATIONS

Seong Jung Kang; High- performance electronics using dense, perfectly aligned array of single—walled carbon nanotubes; Mar. 25, 2007;p. 230-236.*

*Primary Examiner* — Moin Rahman
(74) *Attorney, Agent, or Firm* — Locke Lord LLP; Tim Tingkang Xia, Esq.

(57) ABSTRACT

A method of fabricating a CMOS logic device with SWCNTs includes forming a plurality of local metallic gate structures on a substrate by depositing a metal on the substrate; forming a plurality of contacts on the substrate; and depositing the SWCNTs on the substrate, and doping a certain area of the SWCNTs to form the CMOS logic device having at least one NMOS transistor and at least one PMOS transistor. Each of the NMOS and PMOS transistors has a gate formed by one of the local metallic gate structures, and a source and a drain formed by two of the contacts respectively. The gate of each PMOS transistor and the gate of each NMOS transistor are configured to alternatively receive at least one input voltage. At least one of the drain of the
(Continued)

PMOS transistor and the drain of the NMOS transistor is configured to output an output voltage.

18 Claims, 14 Drawing Sheets

Related U.S. Application Data

(60) Provisional application No. 61/889,841, filed on Oct. 11, 2013.

(51) Int. Cl.
  *H01L 51/00* (2006.01)
  *H01L 51/10* (2006.01)
  *H03K 19/0948* (2006.01)
  *H03K 19/21* (2006.01)

(52) U.S. Cl.
  CPC ...... *H01L 51/0023* (2013.01); *H01L 51/0026* (2013.01); *H01L 51/055* (2013.01); *H01L 51/0525* (2013.01); *H01L 51/0545* (2013.01); *H01L 51/107* (2013.01); *H03K 19/0948* (2013.01); *H03K 19/215* (2013.01); *H01L 51/0048* (2013.01); *H01L 2251/303* (2013.01)

(58) Field of Classification Search
  CPC . H01L 51/107; H01L 51/0525; H01L 51/055; H01L 51/0023; H01L 2251/303; H03K 19/215; H03K 19/0948
  USPC .......... 438/199, 17, 582; 257/635, 741, 476, 257/209, 529
  See application file for complete search history.

(56) References Cited

U.S. PATENT DOCUMENTS

2008/0290418 A1\* 11/2008 Kalburge ........ H01L 21/823807
  257/369
2010/0133511 A1\* 6/2010 Zhou ..................... B82Y 10/00
  257/24

\* cited by examiner

US 9,947,724 B2

ULTRALOW POWER CARBON NANOTUBE LOGIC CIRCUITS AND METHOD OF MAKING SAME

CROSS-REFERENCE TO RELATED PATENT APPLICATIONS

This application is a divisional patent application of U.S. patent application Ser. No. 14/511,705, filed Oct. 10, 2014, now allowed, which itself claims priority to and the benefit of, pursuant to 35 U.S.C. § 119(e), U.S. provisional patent application Ser. No. 61/889,841, filed Oct. 11, 2013, entitled "ULTRALOW POWER CARBON NANOTUBE LOGIC CIRCUITS," by Mark C. Hersam, Michael L. Geier, Pradyumna L. Prabhumirashi, Weichao Xu and Hyungil Kim, each of which is incorporated herein in its entirety by reference.

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, superscript "[n]" represents the nth reference cited in the reference list. For example, superscript [6] represents the 6th reference cited in the reference list, namely, Hersam, M. C. Nature Nanotech. 2008, 3, 387-394.

STATEMENT AS TO RIGHTS UNDER FEDERALLY-SPONSORED RESEARCH

This invention was made with government support under grant numbers DMR-1006391 and DMR-1121262 awarded by the National Science Foundation and under grant number N00014-11-1-0690 awarded by the Office of Naval Research. The government has certain rights in the invention.

FIELD OF THE INVENTION

The present invention relates generally to complementary metal-oxide-semiconductor (CMOS) and carbon nanotube (CNT) technology, and more particularly to ultralow power CMOS logic circuits and devices using CNTs, methods of making the same, and applications of the same.

BACKGROUND OF THE INVENTION

A transistor is a semiconductor device used to amplify and switch electronic signals and electrical power, which is composed of semiconductor material with at least three terminals for connection to an external circuit. Transistors are commonly used logical circuits and devices. However, power consumption during operation of the transistors is a significant issue. In order to reduce the power consumption, various types of transistors and materials used for the transistors have been discussed. However, previous studies have not addressed any transistors or logic circuits with satisfactory ultralow power consumption.

Therefore, a heretofore unaddressed need exists in the art to address the aforementioned deficiencies and inadequacies.

SUMMARY OF THE INVENTION

One aspect of the disclosure provides a complementary metal-oxide-semiconductor (CMOS) logic device formed with single-walled carbon nanotubes (SWCNTs). In certain embodiments, the CMOS logic device includes: at least one p-type metal-oxide-semiconductor (PMOS) thin-film transistor (TFT) formed with the SWCNTs, where each of the at least one PMOS TFT has a gate, a source and a drain; and at least one n-type metal-oxide-semiconductor (NMOS) TFT formed with the SWCNTs, where each of the at least one NMOS TFT has a gate, a source and a drain. The gate of each of the at least one PMOS TFT and the gate of each of the at least one NMOS TFT is configured to alternatively receive at least one input voltage. At least one of the drain of the at least one PMOS TFT and the drain of the at least one NMOS TFT is configured to output an output voltage $V_{OUT}$. In certain embodiments, the gate of each of the at least one PMOS TFT and the gate of each of the at least one NMOS TFT respectively includes a local metallic gate structure formed of a metal.

In one embodiment, a linear tube density of the SWCNTs in the at least one PMOS TFT and the at least one NMOS TFT is about 18 nanotubes/μm.

In certain embodiments, each of the at least one NMOS TFT is chemically doped with benzyl viologen.

In one embodiment, the metal of the local metal gate structure is nickel (Ni).

In certain embodiments, the CMOS logic device has a static power consumption of less than about 0.1 nW in a static state, and a peak power consumption of about 10 nW in a transfer state.

In one embodiment, the CMOS logic device is a logic inverter. In certain embodiment, the at least one PMOS TFT includes a first PMOS TFT; the at least one NMOS TFT includes a first NMOS TFT; and the at least one input voltage includes a common input voltage $V_{IN}$. In certain embodiments, the gate of the first PMOS TFT and the gate of the first NMOS TFT are respectively electrically connected to a common input voltage line for alternatively receiving the common input voltage $V_{IN}$; the drain of the first PMOS TFT and the drain of the first NMOS TFT are respectively electrically connected to a common output voltage line for alternatively outputting the output voltage $V_{OUT}$; the source of the first PMOS TFT is connected to a power supply $V_{DD}$; and the source of the first NMOS TFT is connected to ground. In one embodiment, the CMOS logic device has a low noise margin (NM) of about 0.32 $V_{DD}$, and a high NM of about 0.54 $V_{DD}$.

In one embodiment, the CMOS logic device is a logic NAND gate. In certain embodiment, the at least one PMOS TFT includes a first PMOS TFT and a second PMOS TFT; the at least one NMOS TFT includes a first NMOS TFT and a second NMOS TFT; and the at least one input voltage includes a first input voltage $V_A$ and a second input voltage $V_B$. In certain embodiments, the gate of the first PMOS TFT and the gate of the first NMOS TFT are respectively electrically connected to a first common input voltage line for alternatively receiving the first input voltage $V_A$; the gate of the second PMOS TFT and the gate of the second NMOS TFT are respectively electrically connected to a second common input voltage line for alternatively receiving the second input voltage $V_B$; the drain of the first PMOS TFT, the drain of the second PMOS TFT, and the drain of the first NMOS TFT are respectively electrically connected to a common output voltage line for outputting the output voltage $V_{OUT}$; the source of the first PMOS TFT and the source of the second PMOS TFT are respectively electrically connected to a power supply $V_{DD}$; the source of the first NMOS TFT is electrically connected to the drain of the second NMOS TFT; and the source of the second NMOS TFT is electrically connected to ground.

In one embodiment, the CMOS logic device is a logic NOR gate. In certain embodiment, the at least one PMOS TFT includes a first PMOS TFT and a second PMOS TFT; the at least one NMOS TFT includes a first NMOS TFT and a second NMOS TFT; and the at least one input voltage includes a first input voltage $V_A$ and a second input voltage $V_B$. In certain embodiments, the gate of the first PMOS TFT and the gate of the first NMOS TFT are respectively electrically connected to a first common input voltage line for alternatively receiving the first input voltage $V_A$; the gate of the second PMOS TFT and the gate of the second NMOS TFT are respectively electrically connected to a second common input voltage line for alternatively receiving the second input voltage $V_B$; the drain of the first PMOS TFT, the drain of the first NMOS TFT, and the drain of the second NMOS TFT are respectively electrically connected to a common output voltage line for outputting the output voltage $V_{OUT}$; the source of the second PMOS TFT is electrically connected to a power supply $V_{DD}$; the source of the first PMOS TFT is electrically connected to the drain of the second PMOS TFT; and the source of the first NMOS TFT and the source of the second NMOS TFT are respectively electrically connected to ground.

In certain embodiments, the CMOS logic device further includes: a first encapsulation layer covering the at least one PMOS TFT; and a second encapsulation layer covering the at least one NMOS TFT and the first encapsulation layer. In one embodiment, the first encapsulation layer is formed by a photoresist, and the second encapsulation layer is formed by $Al_2O_3$.

In another aspect of the disclosure, a CMOS logic device formed with carbon nanotubes (CNTs) is provided. In one embodiment, the CMOS logic device includes: at least one PMOS transistor formed with the CNTs, where each of the at least one PMOS transistor has a gate, a source and a drain; and at least one NMOS transistor formed with the CNTs, where each of the at least one NMOS transistor has a gate, a source and a drain. The gate of each of the at least one PMOS transistor and the gate of each of the at least one NMOS transistor is configured to alternatively receive at least one input voltage. At least one of the drain of the at least one PMOS transistor and the drain of the at least one NMOS transistor is configured to output an output voltage $V_{OUT}$. The gate of each of the at least one PMOS transistor and the gate of each of the at least one NMOS transistor respectively comprises a local metallic gate structure formed of a metal.

In certain embodiments, each of the at least one PMOS transistor and each of the at least one NMOS transistor is a TFT.

In one embodiment, the metal of the local metal gate structure is nickel (Ni).

In certain embodiments, the CMOS logic device has a static power consumption of less than about 0.1 nW in a static state, and a peak power consumption of about 10 nW in a transfer state.

In certain embodiments, the CNTs are SWCNTs. In one embodiment, a linear tube density of the SWCNTs in the at least one PMOS transistor and the at least one NMOS transistor is about 18 nanotubes/μm. In certain embodiments, each of the at least one NMOS transistor is chemically doped with benzyl viologen.

In one embodiment, the CMOS logic device is a logic inverter. In certain embodiment, the at least one PMOS transistor includes a first PMOS TFT; the at least one NMOS transistor includes a first NMOS TFT; and the at least one input voltage includes a common input voltage $V_{IN}$. In certain embodiments, the gate of the first PMOS TFT and the gate of the first NMOS TFT are respectively electrically connected to a common input voltage line for alternatively receiving the common input voltage $V_{IN}$; the drain of the first PMOS TFT and the drain of the first NMOS TFT are respectively electrically connected to a common output voltage line for alternatively outputting the output voltage $V_{OUT}$; the source of the first PMOS TFT is connected to a power supply $V_{DD}$; and the source of the first NMOS TFT is connected to ground. In one embodiment, the CMOS logic device has a low NM) of about 0.32 $V_{DD}$, and a high NM of about 0.54 $V_{DD}$.

In one embodiment, the CMOS logic device is a logic NAND gate. In certain embodiment, the at least one PMOS transistor includes a first PMOS TFT and a second PMOS TFT; the at least one NMOS transistor includes a first NMOS TFT and a second NMOS TFT; and the at least one input voltage includes a first input voltage $V_A$ and a second input voltage $V_B$. In certain embodiments, the gate of the first PMOS TFT and the gate of the first NMOS TFT are respectively electrically connected to a first common input voltage line for alternatively receiving the first input voltage $V_A$; the gate of the second PMOS TFT and the gate of the second NMOS TFT are respectively electrically connected to a second common input voltage line for alternatively receiving the second input voltage $V_B$; the drain of the first PMOS TFT, the drain of the second PMOS TFT, and the drain of the first NMOS TFT are respectively electrically connected to a common output voltage line for outputting the output voltage $V_{OUT}$; the source of the first PMOS TFT and the source of the second PMOS TFT are respectively electrically connected to a power supply $V_{DD}$; the source of the first NMOS TFT is electrically connected to the drain of the second NMOS TFT; and the source of the second NMOS TFT is electrically connected to ground.

In one embodiment, the CMOS logic device is a logic NOR gate. In certain embodiment, the at least one PMOS transistor includes a first PMOS TFT and a second PMOS TFT; the at least one NMOS transistor includes a first NMOS TFT and a second NMOS TFT; and the at least one input voltage includes a first input voltage $V_A$ and a second input voltage $V_B$. In certain embodiments, the gate of the first PMOS TFT and the gate of the first NMOS TFT are respectively electrically connected to a first common input voltage line for alternatively receiving the first input voltage $V_A$; the gate of the second PMOS TFT and the gate of the second NMOS TFT are respectively electrically connected to a second common input voltage line for alternatively receiving the second input voltage $V_B$; the drain of the first PMOS TFT, the drain of the first NMOS TFT, and the drain of the second NMOS TFT are respectively electrically connected to a common output voltage line for outputting the output voltage $V_{OUT}$; the source of the second PMOS TFT is electrically connected to a power supply $V_{DD}$; the source of the first PMOS TFT is electrically connected to the drain of the second PMOS TFT; and the source of the first NMOS TFT and the source of the second NMOS TFT are respectively electrically connected to ground.

In certain embodiments, the CMOS logic device further includes: a first encapsulation layer covering the at least one PMOS transistor; and a second encapsulation layer covering the at least one NMOS transistor and the first encapsulation layer. In one embodiment, the first encapsulation layer is formed by a photoresist, and the second encapsulation layer is formed by $Al_2O_3$.

A further aspect of the disclosure relates to a method of fabricating a CMOS logic device with SWCNTs, including: forming a plurality of local metallic gate structures on a substrate by depositing a metal on the substrate; forming a plurality of contacts on the substrate; and depositing the SWCNTs on the substrate, and doping a certain area of the SWCNTs to form the CMOS logic device having at least one NMOS transistor and at least one PMOS transistor, wherein each of the at least one NMOS transistor and each of the at least one PMOS transistor has a gate formed by one of the local metallic gate structures, and a source and a drain formed by two of the contacts respectively. The gate of each of the at least one PMOS transistor and the gate of each of the at least one NMOS transistor is configured to alternatively receive at least one input voltage. At least one of the drain of the at least one PMOS transistor and the drain of the at least one NMOS transistor is configured to output an output voltage $V_{OUT}$.

In certain embodiments, each of the at least one PMOS transistor and each of the at least one NMOS transistor is a TFT.

In one embodiment, the metal of each of the local metal gate structures is nickel (Ni). In a further embodiment, the method further includes: depositing a layer of $Al_2O_3$ over the substrate to cover the Ni of each of the local metal gate structures.

In certain embodiments, the method further includes: depositing a first encapsulation layer on the substrate to cover the at least one PMOS transistor and the at least one NMOS transistor, where the first encapsulation layer is formed by a photoresist; removing a part of the first encapsulation layer to expose the at least one NMOS transistor, such that the remaining first encapsulation layer covers the at least one PMOS transistor; and coating a second encapsulation layer to cover the exposed at least one NMOS TFT and the remaining first encapsulation layer, wherein the second encapsulation layer is formed by $Al_2O_3$.

In certain embodiments, the step of forming a plurality of contacts on the substrate includes: patterning the contacts on the substrate by photolithography.

In certain embodiments, the step of depositing the SWCNTs on the substrate includes: depositing the SWCNTs on a membrane; stamping the membrane with the SWCNTs on the substrate; and submerging the substrate with the membrane and the SWCNTs thereon in a solvent to dissolve the membrane. In one embodiment, the solvent is acetone. In certain embodiments, the step of depositing the SWCNTs on the substrate further includes: covering a plurality of channel areas of the SWCNTs on the substrate with a photoresist; and etching the SWCNTs outside the channel areas by reactive ion etching.

In certain embodiments, the step of doping a certain area of the SWCNTs includes: annealing the substrate in vacuum at an annealing temperature for a period of time; and depositing a benzyl viologen solution onto the certain area of the SWCNTs to form the at least one NMOS transistor. In one embodiment, the annealing temperature is about 200° C., and the period of time is about 1 hour.

In one embodiment, the CMOS logic device is a logic inverter. In certain embodiment, the at least one PMOS transistor includes a first PMOS TFT; the at least one NMOS transistor includes a first NMOS TFT; and the at least one input voltage includes a common input voltage $V_{IN}$. In certain embodiments, the gate of the first PMOS TFT and the gate of the first NMOS TFT are respectively electrically connected to a common input voltage line for alternatively receiving the common input voltage $V_{IN}$; the drain of the first PMOS TFT and the drain of the first NMOS TFT are respectively electrically connected to a common output voltage line for alternatively outputting the output voltage $V_{OUT}$; the source of the first PMOS TFT is connected to a power supply $V_{DD}$; and the source of the first NMOS TFT is connected to ground. In one embodiment, the CMOS logic device has a low NM of about 0.32 $V_{DD}$, and a high NM of about 0.54 $V_{DD}$.

In one embodiment, the CMOS logic device is a logic NAND gate. In certain embodiment, the at least one PMOS transistor includes a first PMOS TFT and a second PMOS TFT; the at least one NMOS transistor includes a first NMOS TFT and a second NMOS TFT; and the at least one input voltage includes a first input voltage $V_A$ and a second input voltage $V_B$. In certain embodiments, the gate of the first PMOS TFT and the gate of the first NMOS TFT are respectively electrically connected to a first common input voltage line for alternatively receiving the first input voltage $V_A$; the gate of the second PMOS TFT and the gate of the second NMOS TFT are respectively electrically connected to a second common input voltage line for alternatively receiving the second input voltage $V_B$; the drain of the first PMOS TFT, the drain of the second PMOS TFT, and the drain of the first NMOS TFT are respectively electrically connected to a common output voltage line for outputting the output voltage $V_{OUT}$; the source of the first PMOS TFT and the source of the second PMOS TFT are respectively electrically connected to a power supply $V_{DD}$; the source of the first NMOS TFT is electrically connected to the drain of the second NMOS TFT; and the source of the second NMOS TFT is electrically connected to ground.

In one embodiment, the CMOS logic device is a logic NOR gate. In certain embodiment, the at least one PMOS transistor includes a first PMOS TFT and a second PMOS TFT; the at least one NMOS transistor includes a first NMOS TFT and a second NMOS TFT; and the at least one input voltage includes a first input voltage $V_A$ and a second input voltage $V_B$. In certain embodiments, the gate of the first PMOS TFT and the gate of the first NMOS TFT are respectively electrically connected to a first common input voltage line for alternatively receiving the first input voltage $V_A$; the gate of the second PMOS TFT and the gate of the second NMOS TFT are respectively electrically connected to a second common input voltage line for alternatively receiving the second input voltage $V_B$; the drain of the first PMOS TFT, the drain of the first NMOS TFT, and the drain of the second NMOS TFT are respectively electrically connected to a common output voltage line for outputting the output voltage $V_{OUT}$; the source of the second PMOS TFT is electrically connected to a power supply $V_{DD}$; the source of the first PMOS TFT is electrically connected to the drain of the second PMOS TFT; and the source of the first NMOS TFT and the source of the second NMOS TFT are respectively electrically connected to ground.

A further aspect of the disclosure may relate to a CMOS logic device formed by any of the methods as described above.

The CMOS logic device as described above may be applicable in an apparatus, which may include one or more of the CMOS logic device as described above.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
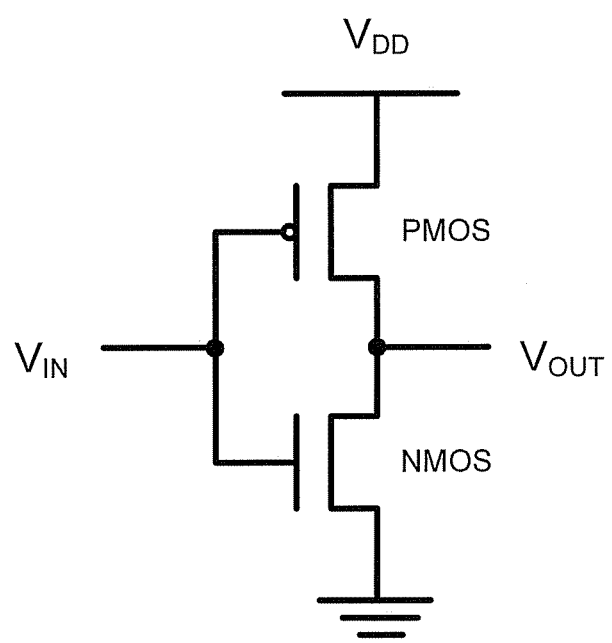
FIG. 1 shows schematically a circuit diagram of a CMOS logic inverter according to certain embodiments of the disclosure.

The present invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Definitions

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "carrying," "having," "containing," "involving," and the like are to be understood to be open-ended, i.e., to mean including but not limited to.

As used herein, if any, the term "scanning electron microscope" or its abbreviation "SEM" refers to a type of electron microscope that images the sample surface by scanning it with a high-energy beam of electrons in a raster scan pattern. The electrons interact with the atoms that make up the sample producing signals that contain information about the sample's surface topography, composition and other properties such as electrical conductivity.

As used herein, a "nanostructure" refers to an object of intermediate size between molecular and microscopic (micrometer-sized) structures. In describing nanostructures, the sizes of the nanostructures refer to the number of dimensions on the nanoscale. For example, nanotextured surfaces have one dimension on the nanoscale, i.e., only the thickness of the surface of an object is between 0.1 and 1000 nm. Sphere-like nanoparticles have three dimensions on the nanoscale, i.e., the particle is between 0.1 and 1000 nm in each spatial dimension. A list of nanostructures includes, but not limited to, nanoparticle, nanocomposite, quantum dot, nanofilm, nanoshell, nanofiber, nanoring, nanorod, nanowire, nanotube, and so on.

OVERVIEW OF THE INVENTION

Certain aspect of the present invention relates to, among other things, single-walled carbon nanotube (SWCNT) complementary metal-oxide-semiconductor (CMOS) logic devices with sub-nanowatt static power consumption and full rail-to-rail voltage transfer characteristics as required for logic gate cascading. These results are enabled by a local metal gate structure that achieves enhancement-mode p-type and n-type SWCNT thin-film transistors (TFTs) with widely separated and symmetric threshold voltages. These complementary SWCNT TFTs are integrated to demonstrate CMOS inverter, NAND, and NOR logic gates at supply voltages as low as 0.8 V with ideal rail-to-rail operation, sub-nanowatt static power consumption, high gain, and excellent noise immunity. This invention provides a direct pathway for solution processable, large area, power efficient SWCNT advanced logic circuits and systems.

SWCNTs possess exceptional electronic characteristics and have been explored for applications in solution processable, flexible, high performance electronics.[1-5] In particular, advances in semiconducting SWCNT sorting[6-10] and integration techniques[11-13] have enabled the fabrication of random network unipolar[14-20] and ambipolar[21-23] logic devices ranging from transistors to 4-bit row decoders.[24] However, as SWCNT electronics moves from individual device demonstrations to highly integrated circuits, unipolar/ambipolar transistors present significant issues, most notably high power consumption. Although there have been demonstrations[25-27] of random network SWCNT-based complementary metal-oxide-semiconductor (CMOS) circuits, these early works did not realize the principal advantage of CMOS logic, namely low power consumption, due to suboptimal threshold voltage control. In this disclosure, SWCNT-based CMOS logic circuits are provided with sub-nanowatt static power consumption via threshold voltage tuning of the constituent p-type and n-type SWCNT transistors. The resulting ultralow power SWCNT CMOS logic circuits possess symmetric voltage transfer curves, high gain, and wide noise margins that are suitable for logic gate cascading and large-scale integration.

The development of solution-processed semiconducting SWCNTs has allowed large-area deposition of random network SWCNT films, leading to extensive studies of SWCNT thin-film transistors (TFTs) in a variety of device structures.[15,16,21] Due to adventitious atmospheric doping of SWCNT TFTs under ambient conditions, p-type unipolar devices have dominated prior efforts that have primarily focused on optimizing the tradeoff between mobility and current on/off ratio ($I_{ON}/I_{OFF}$).[13,14,17] However, when implemented in logic circuits, unipolar devices sustain high steady-state currents, which lead to significant steady-state power consumption during operation. In contrast, CMOS logic is the backbone of modern microelectronics since either the constituent p-type or n-type transistor is turned off in each logic gate, resulting in intrinsically low power consumption and thus the ability to be implemented in efficient large-scale integrated circuits.[28] Moreover, CMOS logic offers large noise margins, which allows robust and reliable operation in highly complex circuitry that inevitably encounters large parametric shifts. These enabling advantages of CMOS technology not only require the realization and integration of p-type and n-type transistors, but also precisely tuned, well-separated threshold voltages to ensure that the complementary devices are not concurrently passing on-current and thus not dissipating high steady-state power. This critical issue has not been addressed in previous SWCNT TFT studies,[14-23] and thus stands as the key challenge limiting the realization of highly integrated SWCNT-based CMOS electronics.

One aspect of the disclosure provides a CMOS logic device formed with SWCNTs. In certain embodiments, the CMOS logic device includes: at least one PMOS TFT formed with the SWCNTs, where each of the at least one PMOS TFT has a gate, a source and a drain; and at least one NMOS TFT formed with the SWCNTs, where each of the at least one NMOS TFT has a gate, a source and a drain. The gate of each of the at least one PMOS TFT and the gate of each of the at least one NMOS TFT is configured to alternatively receive at least one input voltage. At least one of the drain of the at least one PMOS TFT and the drain of the at least one NMOS TFT is configured to output an output voltage $V_{OUT}$. In certain embodiments, the gate of each of the at least one PMOS TFT and the gate of each of the at least one NMOS TFT respectively includes a local metallic gate structure formed of a metal.

In another aspect of the disclosure, a CMOS logic device formed with carbon nanotubes (CNTs) is provided. In one embodiment, the CMOS logic device includes: at least one PMOS transistor formed with the CNTs, where each of the at least one PMOS transistor has a gate, a source and a drain; and at least one NMOS transistor formed with the CNTs, where each of the at least one NMOS transistor has a gate, a source and a drain. The gate of each of the at least one PMOS transistor and the gate of each of the at least one NMOS transistor is configured to alternatively receive at least one input voltage. At least one of the drain of the at least one PMOS transistor and the drain of the at least one NMOS transistor is configured to output an output voltage $V_{OUT}$. The gate of each of the at least one PMOS transistor and the gate of each of the at least one NMOS transistor respectively comprises a local metallic gate structure formed of a metal.

A further aspect of the disclosure relates to a method of fabricating a CMOS logic device with SWCNTs, including: forming a plurality of local metallic gate structures on a substrate by depositing a metal on the substrate; forming a plurality of contacts on the substrate; and depositing the SWCNTs on the substrate, and doping a certain area of the SWCNTs to form the CMOS logic device having at least one NMOS transistor and at least one PMOS transistor, wherein each of the at least one NMOS transistor and each of the at least one PMOS transistor has a gate formed by one of the local metallic gate structures, and a source and a drain formed by two of the contacts respectively. The gate of each of the at least one PMOS transistor and the gate of each of the at least one NMOS transistor is configured to alternatively receive at least one input voltage. At least one of the drain of the at least one PMOS transistor and the drain of the at least one NMOS transistor is configured to output an output voltage $V_{OUT}$.

In certain embodiments, the CMOS logic device as described above and/or formed by the method as described may be a logic inverter, a logic NAND gate, or a logic NOR gate.

These and other aspects of the present invention are further described below.

IMPLEMENTATIONS AND EXAMPLES OF THE INVENTION

Without intent to limit the scope of the invention, exemplary instruments, apparatus, methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Example One

In one embodiment, threshold voltage control is demonstrated for both p-type and n-type SWCNT TFTs via a local Ni gate structure, which enables ultralow power complementary device operation. For example, a high-performance SWCNT CMOS inverter (logic NOT gate) is provided with reference to FIG. 1 as an initial illustration of this device architecture.

FIG. 1 shows schematically a circuit diagram of a CMOS logic inverter according to certain embodiments of the disclosure. As shown in FIG. 1, the CMOS logic inverter includes a p-type MOS (PMOS) transistor and an n-type MOS (NMOS) transistor. Each of the PMOS and NMOS transistors has a gate, a source and a drain. As shown in FIG. 1, the gate of the PMOS transistor and the gate of the NMOS transistor are respectively electrically connected to a common input voltage line for alternatively receiving a common input voltage $V_{IN}$. The drain of the first PMOS transistor and the drain of the NMOS transistor are respectively electrically connected to a common output voltage line for alternatively outputting the output voltage $V_{OUT}$. The source of the PMOS transistor is connected to a power supply $V_{DD}$, and the source of the NMOS transistor is connected to ground. In other words, the PMOS transistor and the NMOS transistor are connected in series.

Figure 2:
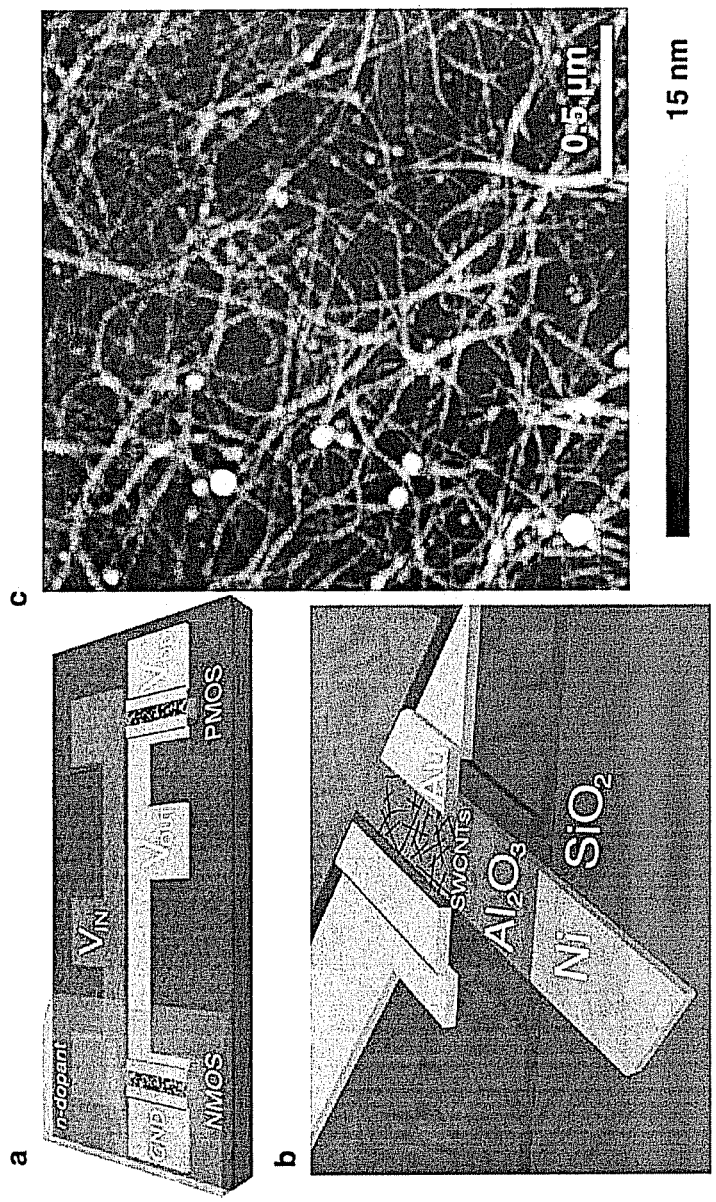
FIG. 2 shows schematically a SWCNT CMOS logic inverter structure according to certain embodiments of the disclosure, where (a) shows the SWCNT CMOS inverter including the unencapsulated p-type TFT and benzyl viologen doped n-type TFT; (b) shows a cross-section of an individual SWCNT TFT, and (c) shows an atomic force microscopy image of the SWCNT film morphology in the TFT channel region.
Figure 3:
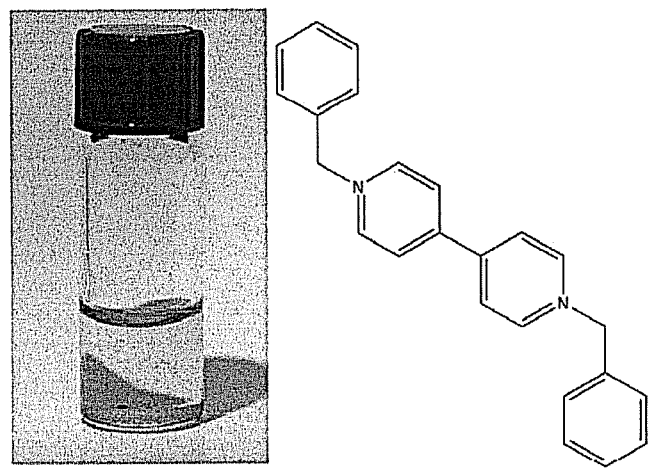
FIG. 3 shows the n-type dopant benzyl viologen in toluene and its chemical structure according to certain embodiments of the disclosure.
Figure 4:
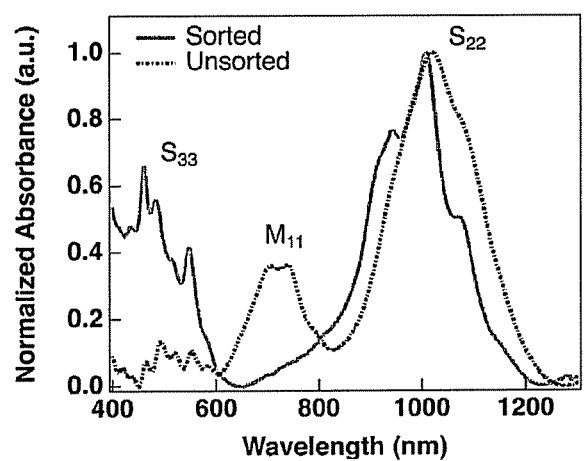
FIG. 4 shows UV-vis-NIR optical absorbance spectra of both sorted and unsorted SWCNTs according to certain embodiments of the disclosure.

FIG. 2 shows schematically a SWCNT CMOS logic inverter structure according to certain embodiments of the disclosure, where (a) shows the SWCNT CMOS inverter including the unencapsulated p-type TFT and benzyl viologen doped n-type TFT; (b) shows a cross-section of an individual SWCNT TFT, and (c) shows an atomic force microscopy image of the SWCNT film morphology in the TFT channel region. FIG. 3 shows the n-type dopant benzyl viologen in toluene and its chemical structure according to certain embodiments of the disclosure. FIG. 4 shows a UV-vis-NIR optical absorbance spectra of both sorted and unsorted SWCNTs according to certain embodiments of the disclosure. As shown in FIG. 2(a), the inverter structure includes an unencapsulated SWCNT p-type TFT and a SWCNT n-type TFT that is chemically doped with benzyl viologen (as shown in FIG. 3).[29] The p-type and n-type TFTs share a common input voltage ($V_{IN}$) at their gates and a common output voltage ($V_{OUT}$) at their drains. In addition, the p-type TFT source is connected to the power supply ($V_{DD}$), and the n-type TFT source is connected to ground (GND). FIG. 2(b) shows the cross-section of an individual SWCNT TFT structure with further details. As shown in FIG. 2(b), the SWCNT TFT includes a 300 nm $SiO_2$ on Si substrate, a local Ni (25 nm thick) gate patterned by photolithography, a conformal 10 nm $Al_2O_3$ layer deposited via atomic layer deposition (ALD), >99% semiconductor purity SWCNTs deposited by vacuum filtration film transfer, and Cr/Au (2 nm/50 nm) source/drain contacts. In addition, the atomic force microscope (AFM) image as shown in FIG. 2(c) illustrates the uniformity of the SWCNT network in the TFT channel region with a linear tube density of ~18 nanotubes/μm (~99% semiconducting purity SWCNTs; see also FIG. 4), which will be described in detail later.

Figure 5:
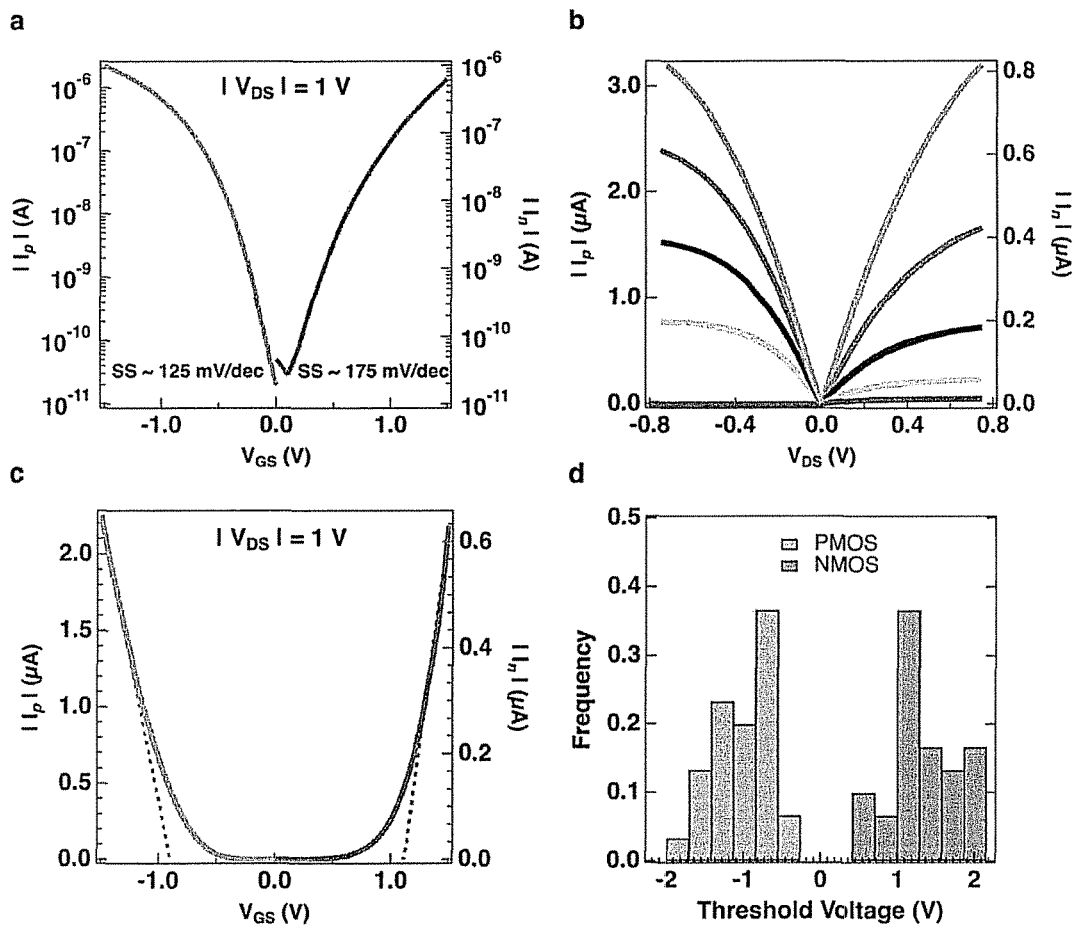
FIG. 5 shows SWCNT TFT electrical characteristics according to certain embodiments of the disclosure, where (a) shows the Log-linear transfer characteristics ($I_{DS}$ vs. $V_{GS}$) of a p-type TFT (blue) at $V_{DS}$=−1 V and n-type TFT (green) at $V_{DS}$=1 V; (b) shows the output characteristics ($I_{DS}$ vs. $V_{DS}$) of a p-type TFT (left axis) from $V_{GS}$=−1 V to 0 V in 0.25 V steps and n-type TFT (right axis) from $V_{GS}$=1 V to 0 V in 0.25 V steps; (c) shows the linear-linear transfer characteristics for PMOS (blue) at $V_{DS}$=−1 V and for NMOS (green) at $V_{DS}$=1 V with the linear region fit shown for $V_T$ extraction; and (d) shows the statistical distribution of $V_T$ for 30 p-type TFTs (blue) and 30 n-type TFTs (green).
Figure 6:
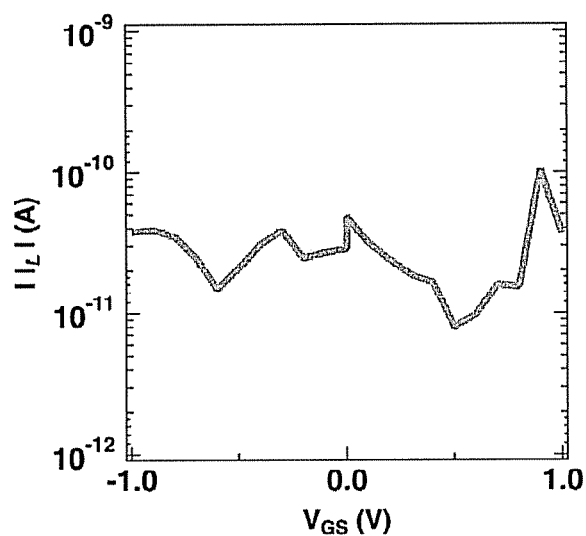
FIG. 6 shows a diagram of gate leakage current vs. $V_{GS}$ according to certain embodiments of the disclosure.
Figure 7:
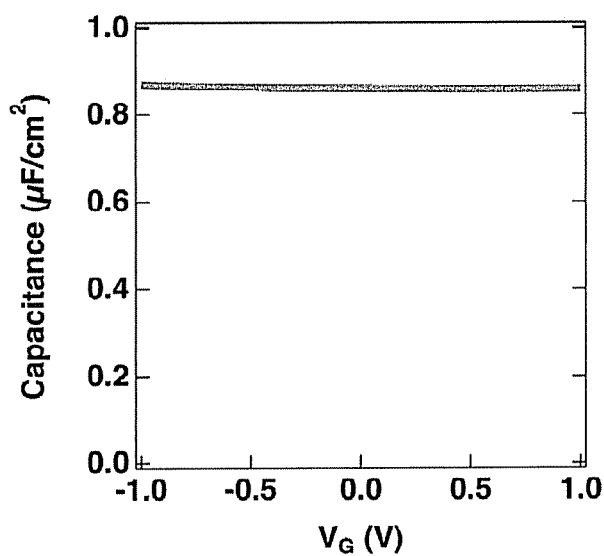
FIG. 7 shows a diagram of capacitance-voltage profile of 10 nm thick ALD $Al_2O_3$ on Ni diagram according to certain embodiments of the disclosure.

FIG. 5 shows SWCNT TFT electrical characteristics according to certain embodiments of the disclosure. FIG. 6 shows a diagram of gate leakage current vs. $V_{GS}$ according to certain embodiments of the disclosure. FIG. 7 shows a diagram of capacitance-voltage profile of 10 nm thick ALD $Al_2O_3$ on Ni diagram according to certain embodiments of the disclosure. Specifically, FIG. 5(a) shows the log-linear transfer characteristics of the constituent p-type and n-type TFTs with channel lengths of 20 μm and widths of 100 μm. The individual transistors have $I_{ON}/I_{OFF}$ of ~$10^5$ and sub-threshold slopes of ~125 mV/decade (p-type) and ~175 mV/decade (n-type) over the CMOS operating voltage range of each device, namely $V_{GS}$ of the p-type TFT is between $-V_{DD}$ and GND, and $V_{GS}$ of the n-type TFT is between GND and $V_{DD}$. The gate dielectric (10 nm $Al_2O_3$) has a leakage current of less than 100 pA (as shown in FIG. 6) in the operational voltage window (−1 V to 1 V) and a capacitance of ~850 nF/$cm^2$ (as shown in FIG. 7). FIG. 5(b) shows well-balanced output characteristics for the p-type TFT ($V_{GS}$ varied from 0 V to −1 V in 0.25 V steps) and n-type TFT ($V_{GS}$ varied from 0 V to 1 V in 0.25 V steps). $V_T$ for both the p-type and n-type TFTs is determined by extrapolation from the linear transfer characteristics as shown in FIG. 5(c). The use of the local metallic (Ni) gate structure is critical to obtaining a negative $V_T$ for p-type SWCNT TFTs as demonstrated previously.[15] Upon conversion of the p-type TFTs to n-type TFTs via benzyl viologen doping, the $V_T$ for the n-type TFT becomes analogously positive, thus achieving the symmetric $V_T$ separation required for ultralow power CMOS. In particular, FIG. 5(d) shows a histogram of extracted $V_T$ for the p-type and n-type TFTs, demonstrating clearly separated and symmetric $V_T$ with negative $V_T$ for the p-type TFTs and positive $V_T$ for the n-type TFTs.

Figure 8:
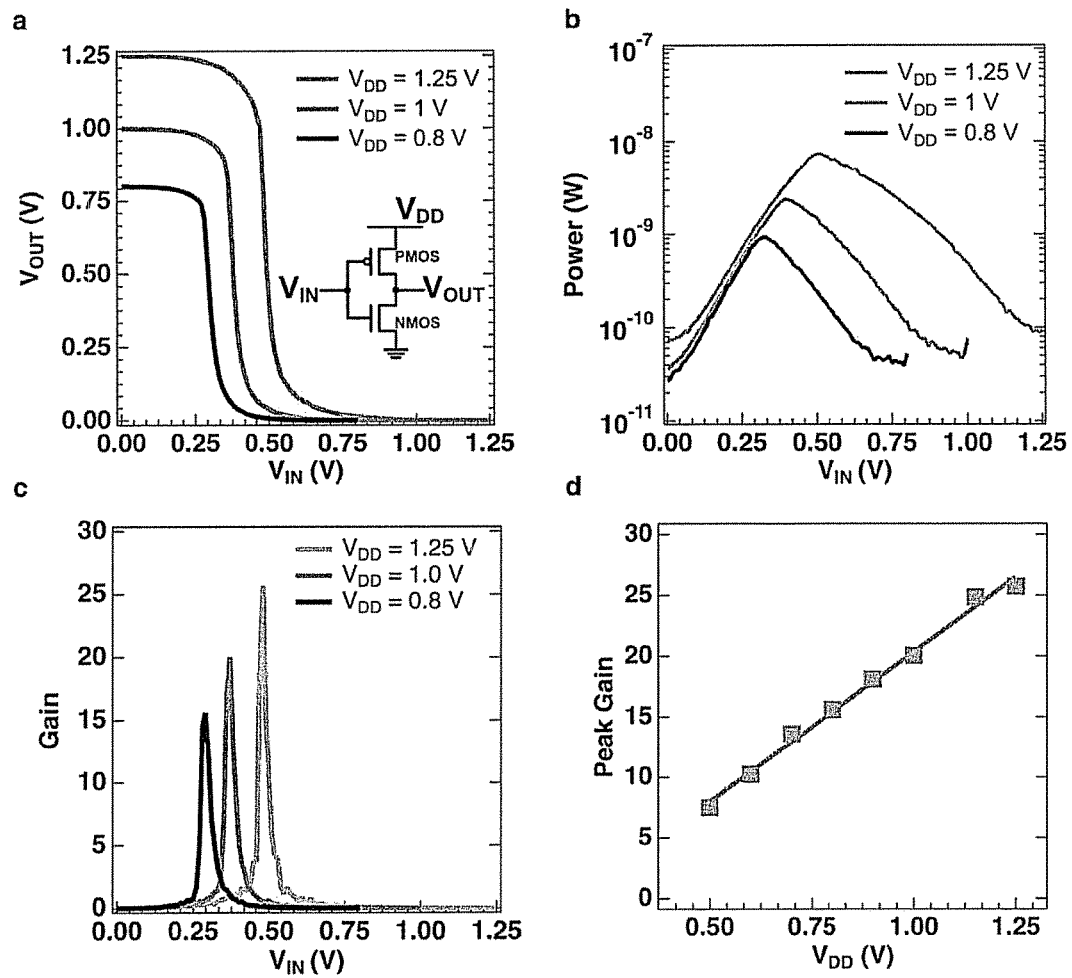
FIG. 8 shows SWCNT CMOS inverter electrical characteristics according to certain embodiments of the disclosure, where (a) shows the voltage transfer curves for $V_{DD}$=0.8 V, 1 V, and 1.25 V; (b) shows power; (c) shows gain characteristics of the CMOS inverter at the same values of $V_{DD}$; and (d) shows linear dependence of peak gain as function of $V_{DD}$.

FIG. 8 shows SWCNT CMOS inverter electrical characteristics according to certain embodiments of the disclosure, where (a) shows the voltage transfer curves for $V_{DD}$=0.8 V, 1 V, and 1.25 V; (b) shows power; (c) shows voltage gain characteristics of the CMOS inverter at the same values of $V_{DD}$; and (d) shows linear dependence of peak gain as function of $V_{DD}$.

As shown in the inset of FIG. 8(a), the CMOS inverter performance is investigated using the device geometry as shown in FIG. 1. FIG. 8(a) shows the inverter voltage transfer characteristics for different supply voltages ($V_{DD}$=0.8 V, 1.0 V, and 1.25 V). At low input voltage ($V_{IN}$=GND), equivalent to logic "0", $V_{OUT}$ is pulled up to $V_{DD}$, equivalent to logic "1". Similarly, at high input voltage ($V_{IN}$=$V_{DD}$), equivalent to logic "1", $V_{OUT}$ is pulled down to GND, equivalent to logic "0". Thus, the SWCNT CMOS inverter demonstrates a full rail-to-rail ($V_{DD}$ to GND) transfer curve in a symmetric operating voltage window. The noise margins (NM) for this device are $NM_{LOW}$=0.32 $V_{DD}$ and $NM_{HIGH}$=0.54 $V_{DD}$ for all $V_{DD}$, thereby providing excellent tolerance against incoming signal variation and suitability for inverter cascading as well as further device integration.

FIG. 8(b) shows the power consumption (P=$V_{DD}$·$I_{GND}$) of the CMOS inverter during transfer at different supply voltages. The power consumption is less than 0.1 nW in the static states of $V_{IN}$=$V_{DD}$ and $V_{IN}$=GND. The peak power consumption is less than 10 nW (for all $V_{DD}$) and occurs approximately at the midpoint of the transfer state ($V_{IN}$=$V_{OUT}$) when the p-type and n-type TFTs are simultaneously in the ON-state. The ultralow power consumption demonstrated by these devices, representing the lowest reported value by 3 orders of magnitude for random network SWCNT-based CMOS logic,[25-27] is enabled by the symmetric and well-separated threshold voltages for the p-type and n-type TFTs. FIG. 8(c) shows the gain ($dV_{OUT}/dV_{IN}$) of the inverter, including a peak gain in excess of 25 at $V_{DD}$=1.25 V. The peak gain shows a linearly increasing relationship, as shown in FIG. 8(d), with respect to $V_{DD}$, and is likely due to $V_{DD}$ being comparable to the threshold voltages of the TFTs, allowing increasing transconductance with increasing $V_{DD}$.

Example Two

Figure 9:
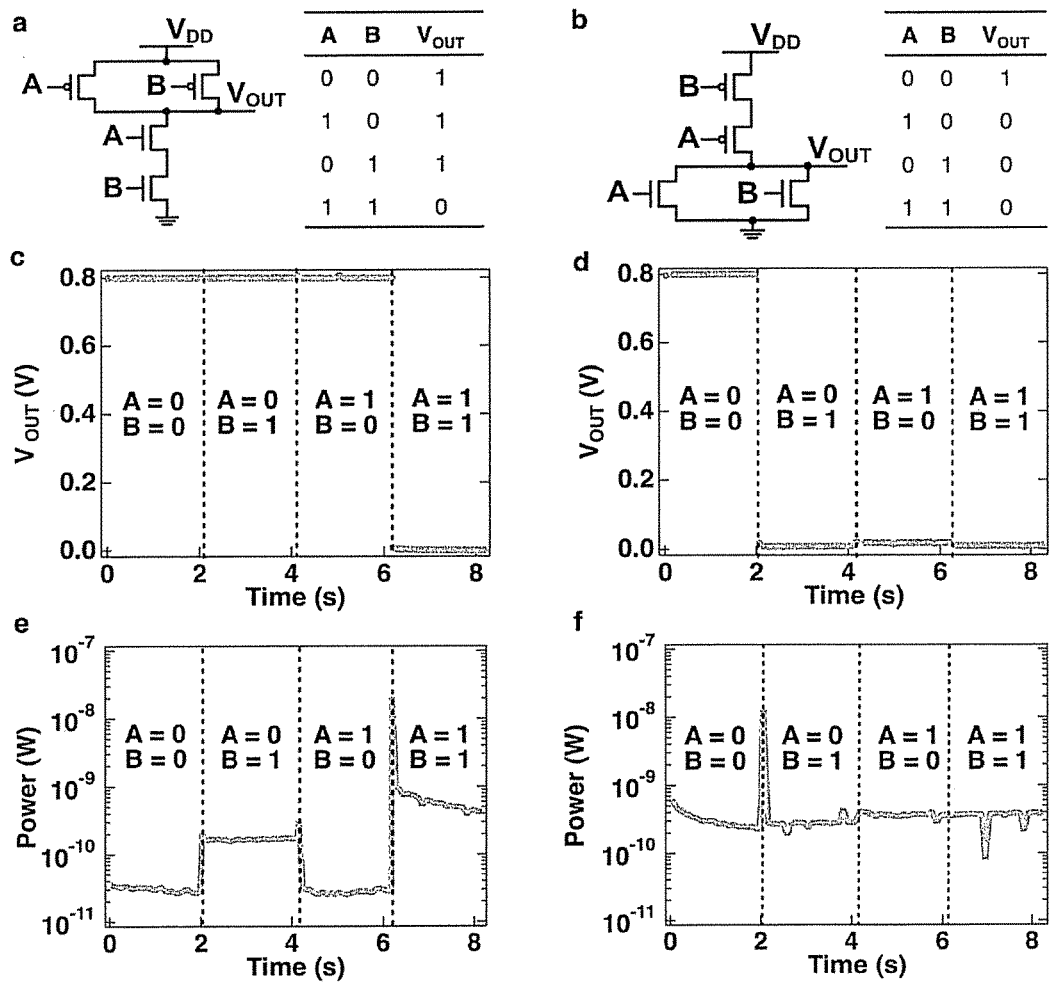
FIG. 9 shows the two-input CMOS NAND and NOR gate electrical characteristics according to certain embodiments of the disclosure, where (a) shows a CMOS logic NAND circuit diagram and associated truth table; (b) shows a CMOS logic NOR circuit diagram and associated truth table; (c) shows the output voltages ($V_{OUT}$) for each possible two input state for the NAND circuit; (d) shows the output voltages ($V_{OUT}$) for each possible two input state for the NOR circuit; (e) shows NAND power consumption for each possible two input state; and (f) shows NOR power consumption for each possible two input state.

To demonstrate the next level of CMOS integration, NAND and NOR logic gates were fabricated. FIG. 9 shows the two-input CMOS NAND and NOR gate electrical characteristics according to certain embodiments of the disclosure, where (a) shows a CMOS logic NAND circuit diagram and associated truth table; (b) shows a CMOS logic NOR circuit diagram and associated truth table; (c) shows the output voltages ($V_{OUT}$) for each possible two input state for the NAND circuit; (d) shows the output voltages ($V_{OUT}$) for each possible two input state for the NOR circuit; (e) shows NAND power consumption for each possible two input state; and (f) shows NOR power consumption for each possible two input state. The supply voltage ($V_{DD}$) for the circuits is 0.8 V. Input voltages of 0 V (GND) and 0.8 V ($V_{DD}$) are treated as logic "0" and "1", respectively.

As shown in FIG. 9(a), a logic NAND gate is realized by connecting two n-type TFTs in series and two p-type TFTs in parallel. Specifically, the NAND gate includes a first PMOS TFT and a second PMOS TFT, and a first NMOS TFT and a second NMOS TFT. The gate of the first PMOS TFT and the gate of the first NMOS TFT are respectively electrically connected to a first common input voltage line for alternatively receiving the first input voltage $V_A$; the gate of the second PMOS TFT and the gate of the second NMOS TFT are respectively electrically connected to a second common input voltage line for alternatively receiving the second input voltage $V_B$; the drain of the first PMOS TFT, the drain of the second PMOS TFT, and the drain of the first NMOS TFT are respectively electrically connected to a common output voltage line for outputting the output voltage $V_{OUT}$; the source of the first PMOS TFT and the source of the second PMOS TFT are respectively electrically connected to a power supply $V_{DD}$; the source of the first NMOS TFT is electrically connected to the drain of the second NMOS TFT; and the source of the second NMOS TFT is electrically connected to ground.

As shown in FIG. 9(b), a logic NOR gate employs two n-type TFTs in parallel and two p-type TFTs in series. Specifically, the NAND gate includes a first PMOS TFT and a second PMOS TFT, and a first NMOS TFT and a second NMOS TFT. The gate of the first PMOS TFT and the gate of the first NMOS TFT are respectively electrically connected to a first common input voltage line for alternatively receiving the first input voltage $V_A$; the gate of the second PMOS TFT and the gate of the second NMOS TFT are respectively electrically connected to a second common input voltage line for alternatively receiving the second input voltage $V_B$; the drain of the first PMOS TFT, the drain of the first NMOS TFT, and the drain of the second NMOS TFT are respectively electrically connected to a common output voltage line for outputting the output voltage $V_{OUT}$; the source of the second PMOS TFT is electrically connected to a power supply $V_{DD}$; the source of the first PMOS TFT is electrically connected to the drain of the second PMOS TFT; and the source of the first NMOS TFT and the source of the second NMOS TFT are respectively electrically connected to ground.

FIGS. 9(c) and 9(d) show $V_{OUT}$ for the four possible input states of A and B for NAND and NOR gates, respectively. In all cases, $V_{IN}$ (A and B) is set at $V_{DD}$ for the logic state "1", and $V_{IN}$ is set at 0 V (GND) for the logic state of "0". For the CMOS NAND logic gate, $V_{OUT}$ becomes logic "0" only when both A and B are in the logic "1" state. Conversely, for the CMOS NOR logic gate, $V_{OUT}$ is the logic "1" level only when both A and B are in the logic "0" state. These tests confirm that in both SWCNT CMOS NAND and NOR devices, the logic gates demonstrate ideal rail-to-rail output voltages for the appropriate two input state. In all static states, the power consumption is on the order of 0.1 nW as shown in FIG. 9(e) for the NAND gate and FIG. 9(f) for the NOR gate. In addition, during the transition between the output states of logic "1" ($V_{OUT}=V_{DD}$) and "0" ($V_{OUT}$=GND), the NAND and NOR gates show a peak power of ~10 nW as expected from the earlier inverter discussion.

Figure 10:
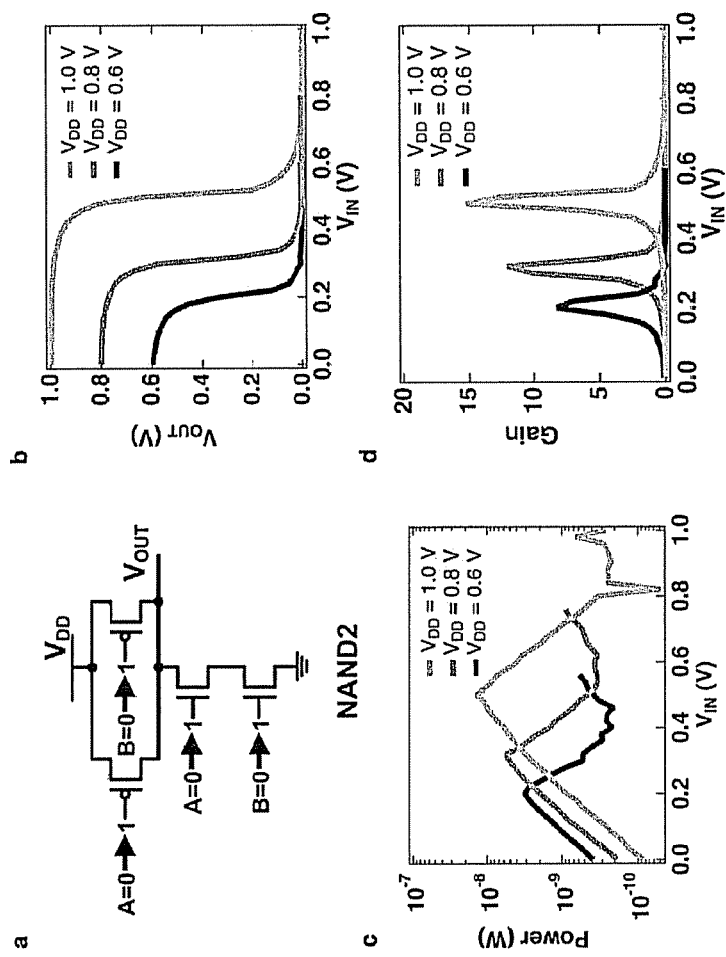
FIG. 10 shows NAND transfer characteristics according to certain embodiments of the disclosure, where (a) shows the transfer schematic, in which inputs A and B are simultaneously swept from a logic "0" state (GND) to a logic "1" state ($V_{DD}$); (b) shows the transfer characteristics at different supply voltages ($V_{DD}$); (c) shows power consumption at different supply voltages ($V_{DD}$) vs. $V_{IN}$; and (d) shows gain at different supply voltages ($V_{DD}$) vs. $V_{IN}$.
Figure 11:
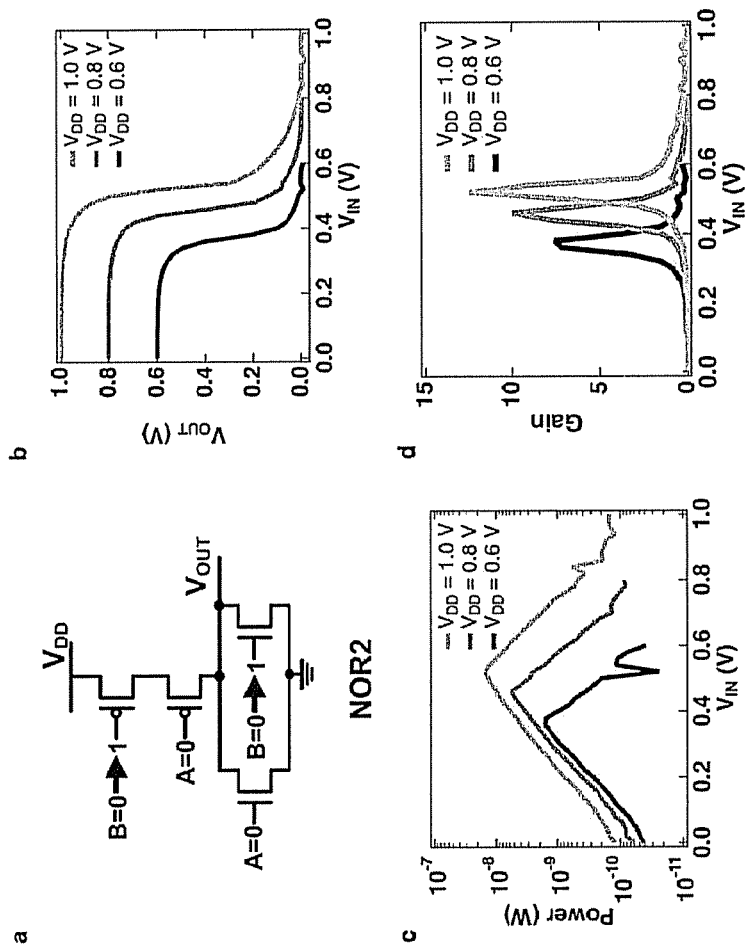
FIG. 11 shows NOR transfer characteristics according to certain embodiments of the disclosure, where (a) shows the transfer schematic, input A is held at logic "0" (GND) while input B is swept from a logic "0" state (GND) to a logic "1" state ($V_{DD}$); (b) shows the transfer characteristics at different supply voltages ($V_{DD}$); (c) shows power consumption at different supply voltages ($V_{DD}$) vs. $V_{IN}$; and (d) shows gain at different supply voltages ($V_{DD}$) vs. $V_{IN}$.

FIG. 10 shows NAND transfer characteristics according to certain embodiments of the disclosure, where (a) shows the transfer schematic, in which inputs A and B are simultaneously swept from a logic "0" state (GND) to a logic "1" state ($V_{DD}$); (b) shows the transfer characteristics at different supply voltages ($V_{DD}$); (c) shows power consumption at different supply voltages ($V_{DD}$) vs. $V_{IN}$; and (d) shows gain at different supply voltages ($V_{DD}$) vs. $V_{IN}$. FIG. 11 shows NOR transfer characteristics according to certain embodiments of the disclosure, where (a) shows the transfer schematic, input A is held at logic "0" (GND) while input B is swept from a logic "0" state (GND) to a logic "1" state ($V_{DD}$); (b) shows the transfer characteristics at different supply voltages ($V_{DD}$); (c) shows power consumption at different supply voltages ($V_{DD}$) vs. $V_{IN}$; and (d) shows gain at different supply voltages ($V_{DD}$) vs. $V_{IN}$. The gain behavior of NAND and NOR gates (as shown in FIGS. 10 and 11) is also similar to the inverter, showing a linear increase in peak gain with respect to applied voltage, $V_{DD}$. Overall, these CMOS NAND and NOR logic gates are suitable for further integration into complex circuits due to their ideal input and output voltage behavior while concurrently possessing sub-nanowatt static power consumption.

Example Three

1. Preparation of Benzyl Viologen Solution for n-Type Single-Walled Carbon Nanotube Transistors In certain embodiments, benzyl viologen dichloride (0.1 g; 97%, Aldrich) was dissolved in 5 mL of deionized water, after which 2 mL of toluene (>99.5%, Sigma Aldrich) was added on top of the water solution, creating a biphasic solution. Next, 1 mL of sodium borohydride (>98% Aldrich) in water (200 mM) was added as a catalytic reducing agent, causing the benzyl viologen solution to turn purple and evolve $H_2$ gas. The biphasic solution was left standing overnight, and the toluene containing ~10 mM benzyl viologen was decanted (as shown in FIG. 3) and used for n-type doping for all n-type transistors.

2. Dispersion and Separation of SWCNTs

In certain embodiments, 45 mg of single-walled carbon nanotubes (SWCNTs) synthesized by the arc discharge method (P2, Carbon Solutions) were added to 6.6 mL of 1% w/v aqueous sodium cholate (SC) solution. This mixture was then sonicated for 60 min at 20% of the maximum tip amplitude using a horn ultrasonicator equipped with a 0.125" diameter probe (Fisher Scientific 500 Sonic Dismembrator). During sonication, the vial was chilled in an ice/water bath. After sonication, 1% w/v aqueous SC and sodium dodecyl sulfate (SDS) solutions containing 60% w/v iodixanol were added to the SWCNT dispersion to obtain the final iodixanol concentration of 32.5% w/v and surfactant ratio of 1:4 (SDS:SC). Prior to ultracentrifugation, the SWCNT dispersion was briefly centrifuged at 3000 rpm for 3 min to eliminate large SWCNT aggregates and carbonaceous impurities. Next, 6 mL of this SWCNT dispersion was carefully inserted below a 15 mL linear density gradient of 15-30% w/v iodixanol (1.08-1.16 g cm$^{-3}$), and 0% w/v iodixanol solution was used to cap the remainder of the ultracentrifuge tube. All solutions contained a 1:4 ratio of 1% w/v SDS/SC. The linear density gradients were then ultracentrifuged for 18 h at 32 krpm in an SW 32 rotor (Beckman Coulter) at a temperature of 22° C. The resulting layer of semiconductor-enriched SWCNTs at the top of the gradient was extracted using a piston gradient fractionator (Biocomp Instruments).

3. Characterization of Semiconducting SWCNTs

In order to estimate the electronic purity of the sorted semiconducting SWCNTs, their optical absorbance spectra were measured with a Cary 5000 spectrophotometer (Agilent Technologies) operating in dual beam mode. Prior to the measurement, the extracted SWCNT fractions were diluted to 850 μL in disposable plastic cuvettes (Fisher Scientific). The baseline optical absorbance was measured with a reference aqueous solution containing 1% w/v of SDS and SC (1:4 ratio) and then subtracted from the sample spectrum. The electronic purity of the sorted semiconducting SWCNTs was determined by first subtracting out the linear background (with respect to energy) and π-plasmon resonance contributions from the measured absorbance spectra, followed by a comparison of the area of the $S_{22}$ peak to that of the $M_{11}$ peak. The semiconducting purity for the sorted SWCNTs was calculated to be ~99%, as shown in FIG. 4.

4. Device Fabrication

All CMOS circuits were fabricated on 300 nm $SiO_2$/Si wafers purchased from Silicon Quest International. Metal gate contacts were patterned by photolithography, where 25 nm of Ni was deposited by thermal evaporation and subsequent liftoff in acetone. Atomic layer deposition (ALD) using trimethylaluminum (TMA) and water at 150° C. (Savannah, Cambridge NanoTech) was then used to deposit 10 nm of $Al_2O_3$ over the entire substrate. Source/drain contacts were then patterned by photolithography and 2 nm/50 nm of Cr/Au were deposited by thermal evaporation, followed by liftoff in acetone. Sorted semiconductor-enriched SWCNTs were then deposited on a cellulose membrane (Millipore VMWP, 0.05 μm pore size) by vacuum filtration. The cellulose membrane was wetted with isopropyl alcohol to attach the membrane by surface tension, gently stamped onto the entire substrate, and submerged in acetone to dissolve the filter membrane. Then, the substrate was patterned by photolithography, covering the SWCNT TFT channel areas with Shipley S1813 photoresist. Reactive ion etching in an oxygen plasma atmosphere (100 mW, 15 sec, 20 sccm $O_2$) etched the nanotubes outside of the channel after which the substrate was soaked in acetone overnight to remove residual organic materials. The substrate was then transferred to a nitrogen atmosphere glove box and annealed in vacuum (50 mTorr) at 200° C. for 1 h. Inside the glove box, the benzyl viologen solution was deposited on the intended n-type TFTs and allowed to dry.

5. Electrical Testing Scheme

Output, transfer, and leakage characteristics of the TFTs and logic devices were measured using Keithley 2400 source meters and home-written Lab View programs. For TFT measurements, the gate voltage was swept at a rate of 0.5 V/sec in steps of 0.05 V from 0 V to $V_{DD}$. For the logic gate measurements, $V_{IN}$ was swept at a rate of 0.1 V/sec in steps of 0.01 V. For all measurements, the input voltages and currents were measured simultaneously for each contact.

6. Dielectric Characterization

As-fabricated substrates containing the Ni gate contact, ALD dielectric, and source/drain contacts were tested for dielectric leakage, with a typical leakage profile given in FIG. 6 (Keithley 2400 source meters). To measure the capacitance of the dielectric, a planar Ni electrode was thermally evaporated, followed by ALD processing and Cr/Au contact pad deposition. The capacitance of the resulting capacitors was measured at 10 kHz with an AC amplitude of 50 mV (Keithley Model 4200-SCS) as shown in FIG. 7.

7. Logic NAND Gate Characterization

The transfer characteristic of the NAND logic gate is shown in FIG. 10. FIG. 10(a) shows the schematic of the transfer states, where $V_{IN}$=A=B, and both inputs are varied from logic "0" (GND) to logic "1" ($V_{DD}$) at the same time. For the NAND gate, as the inputs are varied from a "0,0" state (both A and B are at GND) to a "1,1" state (both A and B are at $V_{DD}$), the output voltage, $V_{OUT}$, transitions from a logical "1" ($V_{DD}$) to a logical "0" (GND) state. The transfer characteristics are shown in FIG. 10(b) for varying supply voltages $V_{DD}$=0.6 V, 0.8 V, and 1 V. The corresponding power consumption at various $V_{DD}$ is shown in FIG. 10(c), where the static power consumption is less than 1 nW (occurring at the endpoints, i.e. at logic "0" and "1") and the peak power is 10 nW (occurring at $V_{IN}$=$V_{OUT}$) for all $V_{DD}$. FIG. 10(d) shows gain vs. $V_{IN}$, where the peak gain shows a linear increase with $V_{DD}$ similar to the inverter as shown in FIG. 5.

8. Logic NOR Gate Characterization

The transfer characteristic of the NOR logic gate is shown in FIG. 11. FIG. 11(a) shows the schematic of the transfer states, where $V_{IN}$=B and A is held at logic "0" (GND), while B is varied from logic "0" (GND) to logic "1" ($V_{DD}$). For the NOR gate, as the inputs are varied from a "0,0" state (both A and B are at GND) to a "0,1" state (A is at GND and B is at $V_{DD}$), the output voltage, $V_{OUT}$, transitions from a logical "1" ($V_{DD}$) to a logical "0" (GND) state. The transfer characteristics are shown in FIG. 11(b) for varying supply voltages $V_{DD}$=0.6 V, 0.8 V, and 1 V. The corresponding power consumption at various $V_{DD}$ is shown in FIG. 11(c), where the static power consumption is about 0.1 nW (occurring at the endpoints, i.e. at logic "0" and "1") and the peak power is 10 nW (occurring at $V_{IN}$=$V_{OUT}$) for all $V_{DD}$. FIG. 11(d) shows gain vs. $V_{IN}$, where the peak gain shows linear increase with $V_{DD}$, which is similar to the inverter shown in FIG. 5.

9. Stability of n-Type SWCNT TFTs

The stability of the n-type SWCNT TFTs fabricated using benzyl viologen as a dopant molecule has been previously studied in the literature. Similarly, the inventors find that the individual n-type SWCNT TFTs as well as the CMOS logic circuits are environmentally stable when stored under inert conditions (i.e., in a glove box).

Figure 12:
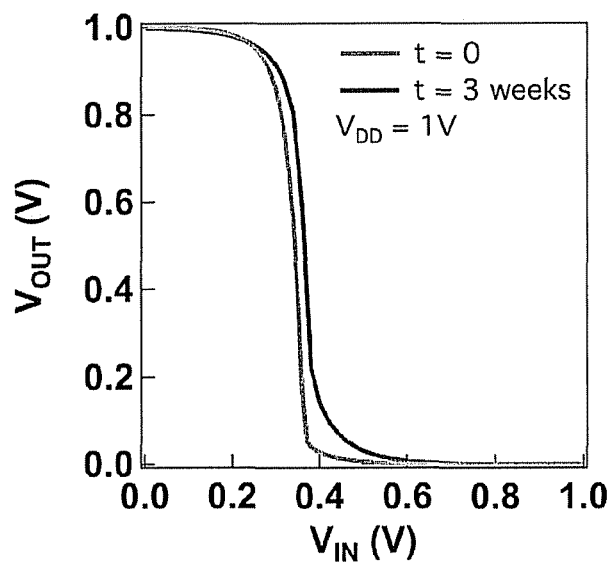
FIG. 12 shows voltage transfer curves (at $V_{DD}$=1 V) for an SWCNT CMOS inverter taken 3 weeks apart according to certain embodiments of the disclosure.

FIG. 12 shows voltage transfer curves (at $V_{DD}$=1 V) for an SWCNT CMOS inverter taken 3 weeks apart according to certain embodiments of the disclosure. As shown in FIG. 12, a typical inverter shows minimal degradation in functionality, including maintaining a full rail-to-rail swing, when measured after 3 weeks.

10. Hysteresis of n-Type SWCNT TFTs

Figure 13:
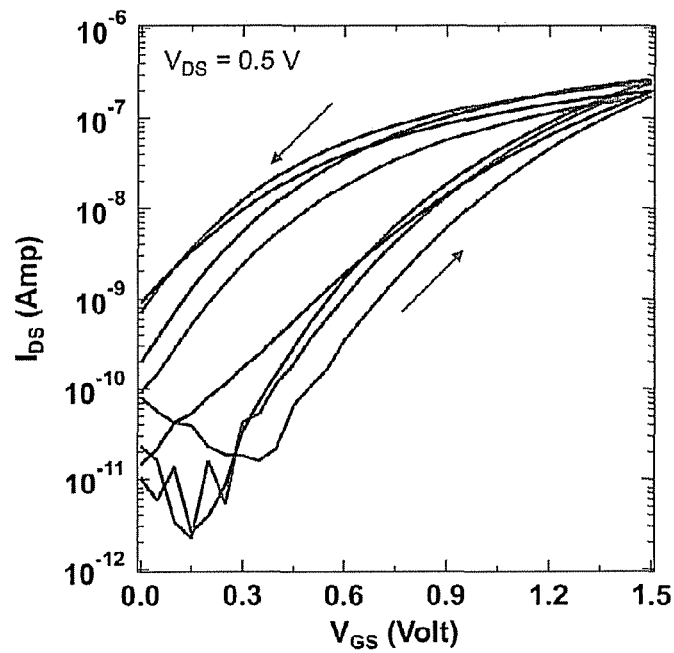
FIG. 13 shows hysteresis and representative IDS-VGS curves for n-type SWCNT TFTs according to certain embodiments of the disclosure, where typical transfer plots (taken at $V_{DS}$=0.5 V) for 4 different n-type SWCNT TFTs, and the arrows indicate the direction of the voltage sweep.

FIG. 13 shows hysteresis and representative IDS-VGS curves for n-type SWCNT TFTs according to certain embodiments of the disclosure, where typical transfer plots (taken at $V_{DS}$=0.5 V) for 4 different n-type SWCNT TFTs, and the arrows indicate the direction of the voltage sweep. As shown in FIG. 13, the n-type SWCNT TFTs show a hysteresis of ~0.3 V in the appropriate CMOS voltage operation window (0<$V_{GS}$<1.5 V).

11. Variability of n-Type SWCNT TFTs

Figure 14:
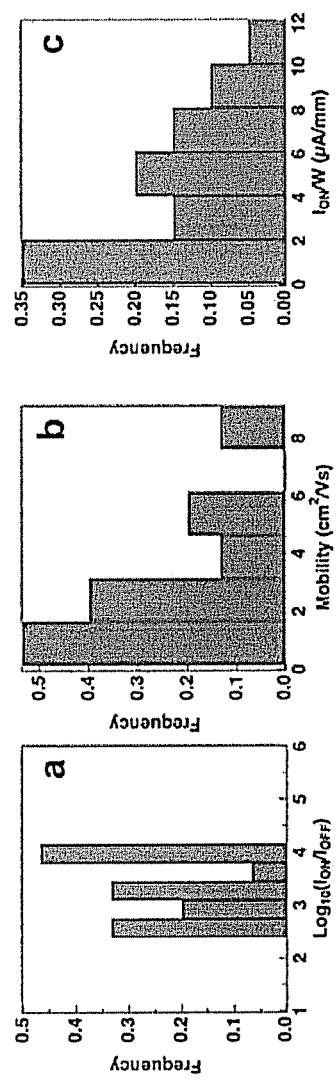
FIG. 14 shows variability of n-type SWCNT TFTs according to certain embodiments of the disclosure, where histograms of 20 representative n-type SWCNT TFTs are used, and (a) shows $I_{ON}/I_{OFF}$ ratio, (b) shows electron mobility, and (c) shows channel width normalized ON current ($I_{ON}/W$), measured at $V_{DS}$=0.1 V. All devices have a channel width of 100 μm and a channel length of 20 μm.

FIG. 14 shows variability of n-type SWCNT TFTs according to certain embodiments of the disclosure, where histograms of 20 representative n-type SWCNT TFTs are used, and (a) shows $I_{ON}/I_{OFF}$ ratio, (b) shows electron mobility, and (c) shows channel width normalized ON current ($I_{ON}$/W), measured at $V_{DS}$=0.1 V. All devices have a channel width of 100 µm and a channel length of 20 µm. The mean values and associated variations of these metrics are as follows: $\text{Log}_{10}$ ($I_{ON}/I_{OFF}$): 3.32±0.6, Mobility: 2.6±2.2 cm$^2$/Vs, $I_{ON}$/W: 4.1±3.25 µA/mm, $V_T$: 1.36±0.47 V ($V_T$ histogram included in FIG. 5(d)).

In conclusion, SWCNT-based CMOS inverter, NOR, and NAND gates have been demonstrated, which constitute the fundamental building blocks of large-scale integrated digital logic circuits, with sub-nanowatt static power consumption, thereby realizing the primary benefit of the CMOS architecture. This enabling advance was accomplished through precise tuning of the p-type and n-type TFT threshold voltages to match the ideal conditions for an integrated CMOS device. The resulting logic gates exhibit symmetric rail-to-rail operation and excellent noise immunity, which will allow for cascaded multiple logic gates in highly integrated circuits. These results coupled with the many other unique attributes of SWCNTs (e.g., solution processability, mechanical flexibility, chemical and thermal stability, and high mobility) provide a direct pathway to large area, ultralow power nanoelectronic systems.

Example Four

Further expansion of the work has been performed in characterizing the air stability of single walled carbon nanotube (SWCNT) thin film transistors (TFTs) while preparing to further integrate logic circuits with increasing complexity/functionality. In certain embodiments, it is demonstrated that the electronic properties of both p-type and n-type SWCNT TFTs change during exposure to atmosphere leading to deterioration of TFT properties needed for proper circuit operation. A process is created for encapsulating p-type SWCNT TFTs and n-type SWCNT TFTs, which stabilizes advantageous electronic properties for complementary logic circuit operation. Further, it is demonstrated that these processes with hundreds of transistors over a large area giving the results unprecedented statistical significance for complementary SWCNT TFT characterization. The inventors performed simulating and designing of the first complementary static random access memory (SRAM) cells based on SWCNT TFTs for a demonstration of large area complementary logic circuits with integration levels and functionality not previously demonstrated.

1. Time Stability of p-Type and n-Type SWCNT TFTs

Figure 15:
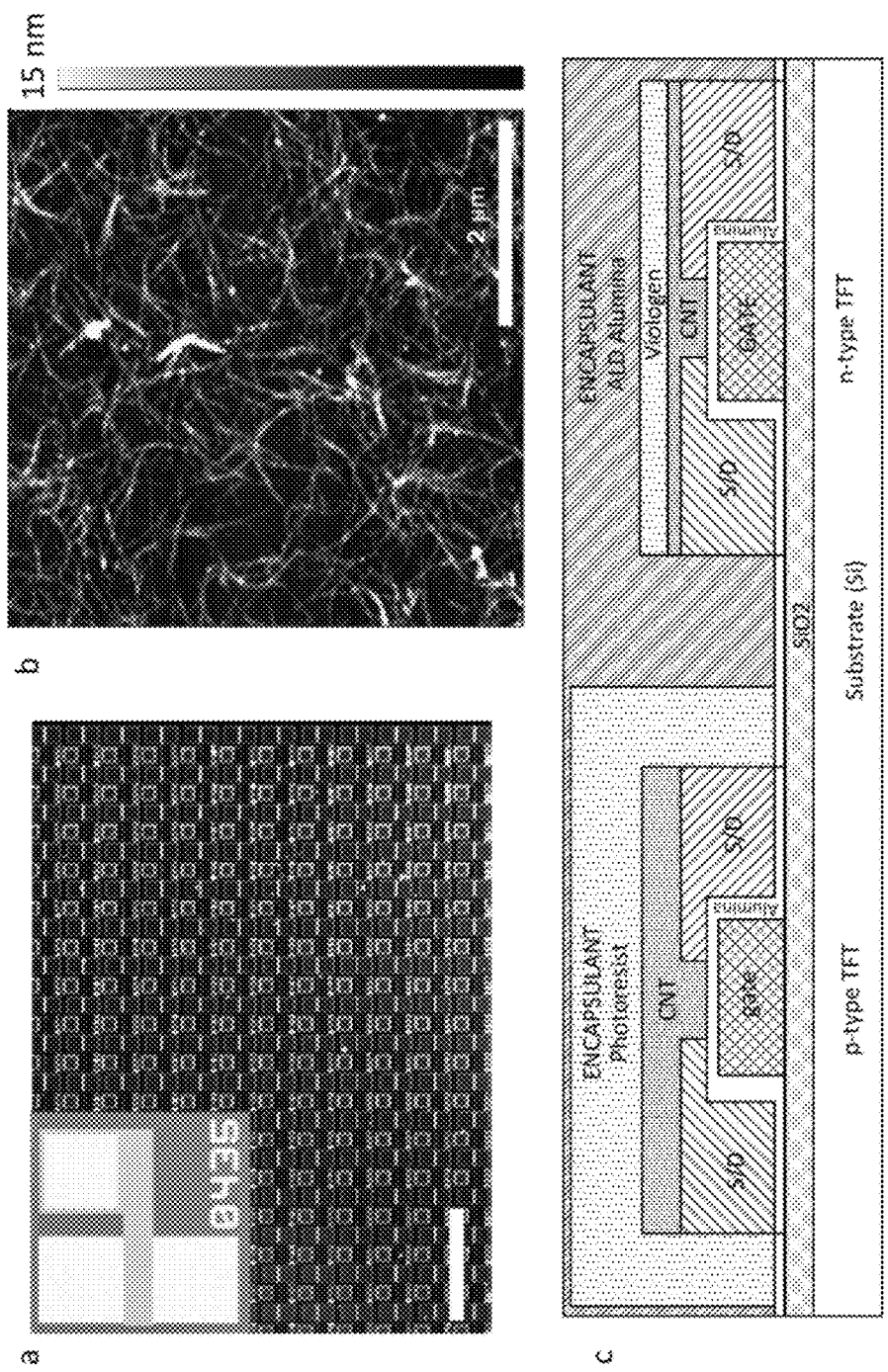
FIG. 15 shows array of p-type and n-type SWCNT TFTs according to certain embodiments of the disclosure, where (a) shows optical micrographs of the fabricated SWCNT TFT device (inset) and array of SWCNT TFTs (Scale bar: inset: 200 μm, a: 1 mm); (b) shows atomic force micrograph of the random network SWCNT morphology in the TFT channel; and (c) shows schematic cross-sections of both p-type SWCNT TFT and n-type SWCNT TFT. TFTs are fabricated using $SiO_2$ (300 nm) on a Si substrate, a local Ni (25 nm) gate, $Al_2O_3$ (10 nm) gate dielectric deposited by atomic layer deposition (ALD), gate via channel through the dielectric by reactive ion etching, Cr/Au (1 nm/50 nm) source/drain contacts, >98% semiconducting SWCNTs deposited by vacuum filtration film transfer method, p-type encapsulant (~1.3 μm S1813 photoresist), n-type dopant benzyl viologen (~100 nm), and final top encapsulant (50 nm ALD $Al_2O_3$).

FIG. 15 shows array of p-type and n-type SWCNT TFTs according to certain embodiments of the disclosure, where (a) shows optical micrographs of the fabricated SWCNT TFT device (inset) and array of SWCNT TFTs (Scale bar: inset: 200 µm, a: 1 mm); (b) shows atomic force micrograph of the random network SWCNT morphology in the TFT channel; and (c) shows schematic cross-sections of both p-type SWCNT TFT and n-type SWCNT TFT. TFTs are fabricated using $SiO_2$ (300 nm) on a Si substrate, a local Ni (25 nm) gate, $Al_2O_3$ (10 nm) gate dielectric deposited by atomic layer deposition (ALD), gate via channel through the dielectric by reactive ion etching, Cr/Au (1 nm/50 nm) source/drain contacts, >98% semiconducting SWCNTs deposited by vacuum filtration film transfer method, p-type encapsulant (~1.3 µm S1813 photoresist), n-type dopant benzyl viologen (~100 nm), and final top encapsulant (50 nm ALD $Al_2O_3$).

The electronic properties of SWCNT TFTs have not been thoroughly characterized for ambient stability and little to no work has been done previously to determine the time scale of electronic stability. One of the major barriers to the creation of large-scale integrated circuits based on complementary SWCNT TFTs is the lack of reproducible and stable electronic properties needed for proper CMOS circuit operation.

The fabrication of the stable SWCNT TFTs is the same as previous p-type and n-type SWCNT TFTs but with a modified final structure for the doping scheme and encapsulation as shown in FIG. 15. After the p-type TFTs are fabricated, they are vacuum annealed for 1 hour at 200° C. to remove atmospheric dopants. The device is then encapsulated with photoresist (Shipley S1813) without ever being exposed to atmosphere by spin coating the encapsulant in a nitrogen atmosphere glovebox. Photolithography is then performed to expose all areas except the p-type SWCNT TFT channel region. The remaining channels are converted to n-type TFTs by again vacuum annealing for 1 hour at 200° C., and then spin coating benzyl viologen n-type dopant in a nitrogen atmosphere glovebox without any exposure to atmosphere. Finally, 50 nm of $Al_2O_3$ are deposited by atomic layer deposition (ALD) for a final encapsulation top layer.

Figure 16:
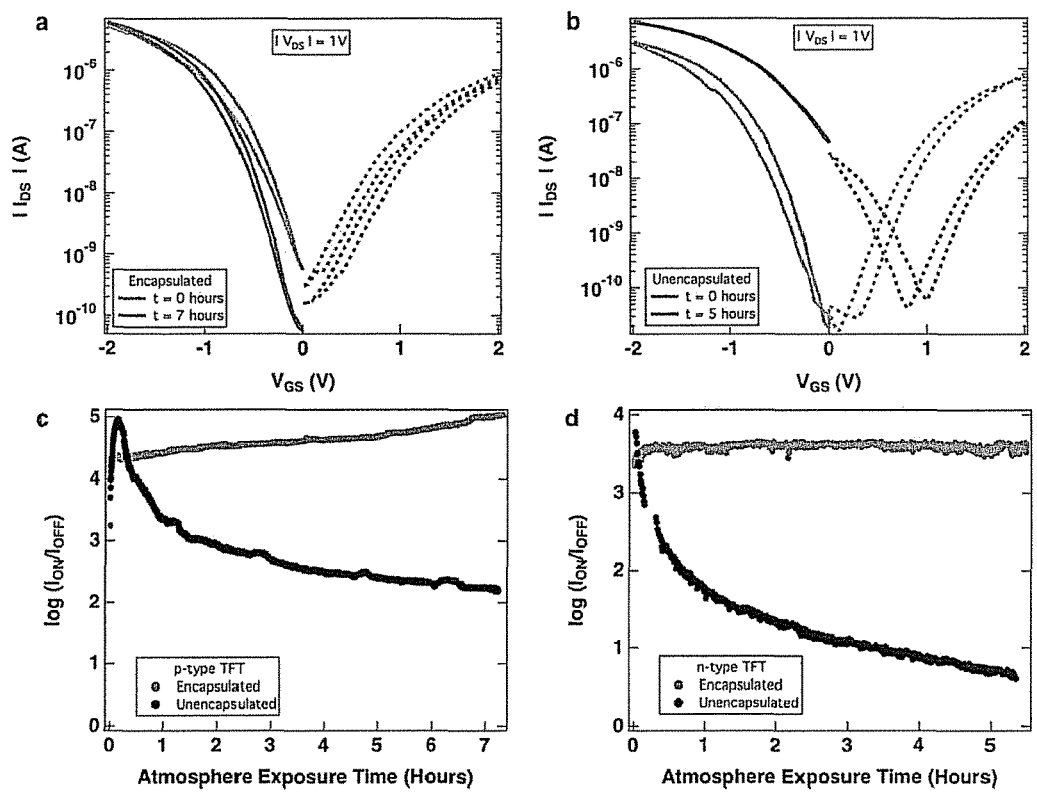
FIG. 16 shows time stability of p-type and n-type SWCNT TFTs electrical properties according to certain embodiments of the disclosure, where (a) shows the log-linear transfer ($I_{DS}$-$V_{GS}$) curves for final encapsulated p-type (solid) and n-type (dashed) SWCNT TFTs measured initially after exposure to atmosphere (blue) and after 7 hours of atmospheric exposure (green) at $V_{DS}$=1 V; (b) shows the log-linear transfer ($I_{DS}$-$V_{GS}$) curves for unencapsulated SWCNT TFTs p-type (solid) and n-type (dashed) TFTs measured initially after exposure to atmosphere (blue) and after 5 hours of atmospheric exposure (red); (c) shows the $\log(I_{ON}/I_{OFF})$ of p-type TFTs vs. atmospheric exposure time for repeated transfer measurements of a single encapsulated (purple) and unencapsulated (black) SWCNT TFT; and (d) shows the $\log(I_{ON}/I_{OFF})$ of n-type TFTs vs. atmospheric exposure time for repeated transfer measurements of a single encapsulated (purple) and unencapsulated (black) SWCNT TFT.

FIG. 16 shows time stability of p-type and n-type SWCNT TFTs electrical properties according to certain embodiments of the disclosure, where (a) shows the log-linear transfer ($I_{DS}$-$V_{GS}$) curves for final encapsulated p-type (solid) and n-type (dashed) SWCNT TFTs measured initially after exposure to atmosphere (blue) and after 7 hours of atmospheric exposure (green) at $V_{DS}$=1 V; (b) shows the log-linear transfer ($I_{DS}$-$V_{GS}$) curves for unencapsulated SWCNT TFTs p-type (solid) and n-type (dashed) TFTs measured initially after exposure to atmosphere (blue) and after 5 hours of atmospheric exposure (red); (c) shows the log($I_{ON}/I_{OFF}$) of p-type TFTs vs. atmospheric exposure time for repeated transfer measurements of a single encapsulated (purple) and unencapsulated (black) SWCNT TFT; and (d) shows the log($I_{ON}/I_{OFF}$) of n-type TFTs vs. atmospheric exposure time for repeated transfer measurements of a single encapsulated (purple) and unencapsulated (black) SWCNT TFT.

TFTs with and without encapsulation are tested for their time stability both using individual TFTs repeatedly measured over several hours and over 800 TFTs measured once for a similar testing period. The $V_{GS}$ range is limited to the operating range of CMOS transistors, from $V_{GS}$=0V to $|V_{DD}|$, because this is the only relevant operating voltages within a CMOS circuit. The transfer curves for encapsulated TFTs are shown in FIG. 16(a) after initial exposure to air and after 7 hours of repeated testing in atmosphere. For both encapsulated p-type and n-type SWCNT TFTs, enhanced or stable electronic properties are observed over the 7-hour testing period. In contrast, FIG. 16(b) shows unencapsulated p-type SWCNT TFTs displaying significant deterioration of relevant metrics like the $I_{ON}/I_{OFF}$ current ratio. $I_{ON}$ is defined as $I_{DS}$ at $V_{GS}=|V_{DD}|$ and $I_{OFF}$ is defined as $I_{DS}$ at $V_{GS}=0$ V. Over 5 hours, $I_{ON}/I_{OFF}$ current ratio for both unencapsulated p-type and n-type TFTs decreases by ~3 orders of magnitude. FIG. 16(c) and FIG. 16(d) show the time evolution of $\log(I_{ON}/I_{OFF})$ for p-type and n-type SWCNT TFTs, respectively. Clearly, encapsulated TFTs experience stable or enhanced $I_{ON}/T_{OFF}$ current ratio over time, while the unencapsulated SWCNT TFTs experience significant degradation of $I_{ON}/I_{OFF}$ current ratio over the same time period. This deterioration would cause CMOS circuits to no longer function properly.

2. Large-Scale Device Property Statistics

Figure 17:
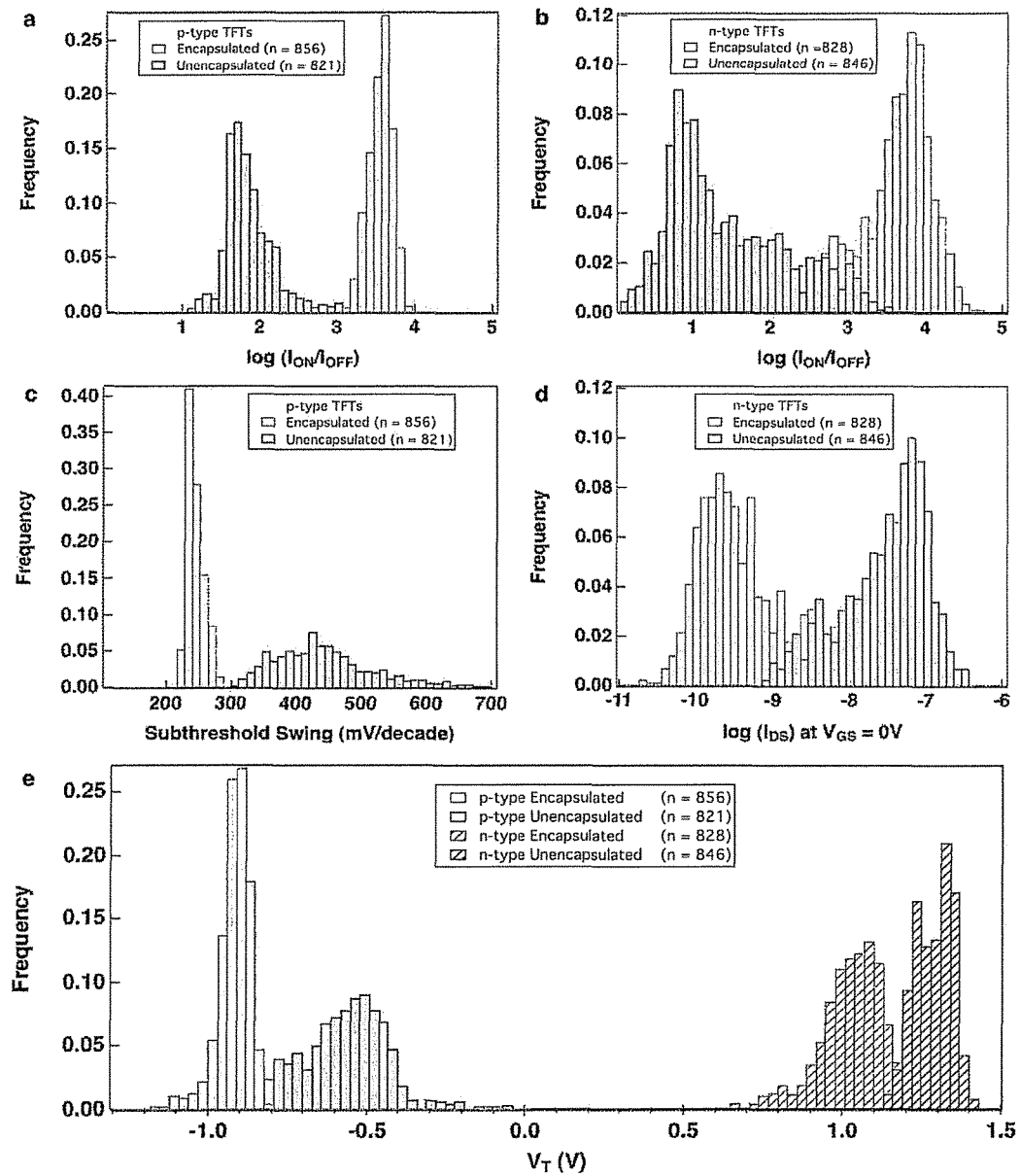
FIG. 17 shows histograms for large sample statistics of SWCNT TFT electronic properties according to certain embodiments of the disclosure, where (a)-(b) show the $\log(I_{ON}/I_{OFF})$ of p-type and n-type TFTs for encapsulated (purple) and unencapsulated (black) where each device is measured once; (c) shows subthreshold swing for encapsulated (purple) and unencapsulated (black) p-type SWCNT TFTs; (d) shows log($I_{DS}$) values when $V_{GS}$=0V for encapsulated (purple) and unencapsulated (black) n-type TFTs; and (e) shows the threshold voltage distributions for encapsulated (purple) and unencapsulated (black) p-type (solid) and n-type (striped) TFTs.

FIG. 17 shows histograms for large sample statistics of SWCNT TFT electronic properties according to certain embodiments of the disclosure, where (a)-(b) show the $\log(I_{ON}/I_{OFF})$ of p-type and n-type TFTs for encapsulated (purple) and unencapsulated (black) where each device is measured once; (c) shows subthreshold swing for encapsulated (purple) and unencapsulated (black) p-type SWCNT TFTs; (d) shows $\log(I_{DS})$ values when $V_{GS}=0V$ for encapsulated (purple) and unencapsulated (black) n-type TFTs; and (e) shows the threshold voltage distributions for encapsulated (purple) and unencapsulated (black) p-type (solid) and n-type (striped) TFTs.

The phenomenon is consistent over large numbers of TFTs as demonstrated in FIG. 17. Each TFT is only measured once within the operating voltages defined above, and do not include the enhancements achieved through repeated measurement. FIG. 17 (a) and (b) show the $\log(I_{ON}/I_{OFF})$ values for both encapsulated and unencapsulated p-type and n-type SWCNT TFTs. Both encapsulated p-type and n-type SWCNT TFTs exhibit high $\log(I_{ON}/I_{OFF})$ current ratios, with both having an average of 3.5+/−0.15 (p-type)+/−0.53 (n-type) for over 800 TFTs. Unencapsulated TFTs have low $\log(I_{ON}/I_{OFF})$ current ratio averages of 1.82+/−0.38 (p-type) and 1.39+/−0.77 (n-type) with long tails for these distributions. The $I_{ON}/I_{OFF}$ current ratio for encapsulated TFTs are suitable for CMOS circuit operation, whereas unencapsulated TFTs are highly variable and thus not appropriate for large scale CMOS circuit integration.

The cause of the decreased $I_{ON}/I_{OFF}$ current ratio can be attributed to changes in electronic properties. For p-type SWCNT TFTs, the increase in subthreshold swing is the main reason for the deterioration in functionality. Encapsulated TFTs as shown in FIG. 17(c) have a uniformly low and narrow value of 236+/−13 mV/decade compared to unencapsulated TFTs having high values and a broad distribution of 483+/−146 mV/decade. For n-type TFTs, the increase in $I_{DS}$ at $V_{GS}=0$ V is the main factor in the decreased $I_{ON}/I_{OFF}$ current ratio. FIG. 17(d) shows the values for $\log(I_{DS})$ at $V_{GS}=0$ V, where encapsulated TFTs have an average log ($I_{OFF}$) of −9.42+/−0.6, and unencapsulated TFTs have an average of −7.6+/−0.56. This increase of almost 2 orders of magnitude is the primary cause of decreased $I_{ON}/I_{OFF}$ current ratio.

Additionally, threshold voltage shifts also contribute to the deterioration of the $I_{ON}/I_{OFF}$ current ratios. For both p-type and n-type encapsulated TFTs shown in FIG. 17(e), the threshold voltages are consistently to the left of unencapsulated TFTs. These threshold voltages are more symmetric about $V_{GS}=0$ V than the unencapsulated TFTs, leading to advantageous symmetric operating voltages required for CMOS circuit operation. $V_T$ for encapsulated p-type SWCNT TFTs is −0.93+/−0.046 V, while $V_T$ for unencapsulated p-type SWCNT TFTs is −0.62+/−0.18 V. Similarly, for encapsulated n-type TFTs $V_T$ is 1.01+/−0.1V and unencapsulated n-type TFTs have a $V_T$ of 1.26+/−0.057 V. The encapsulated TFTs both have threshold voltages near |1 V| while unencapsulated TFTs are shifted ~0.3 V in the positive direction, leading to unbalanced transfer characteristics in the given operating window of CMOS circuits, between $V_{GS}=0$ V and $V_{GS}=|V_{DD}|$. All of the improvements in SWCNT TFT properties and stability will enable more complex TFTs to be created due to the predictability of fabricated SWCNT TFTs. These statistics are used to develop transistor models for circuit simulation enabling more complex circuits to be built. We are currently simulating and designing static random access memory (SRAM) cells on large scales that will demonstrate complex operation and functionality not yet demonstrated for CMOS SWCNT TFTs.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES (1) De Volder, M. F. L.; Tawfick, S. H.; Baughman, R. H.; Hart, A. J. Science 2013, 339, 535-539.
(2) Wang, C.; Takei, K.; Takahashi, T.; Javey, A. Chem. Soc. Rev. 2013, 42, 2592-2609.
(3) Avouris, P.; Chen, Z.; Perebeinos, V. Nature Nanotech. 2007, 2, 605-615.
(4) Rutherglen, C.; Jain, D.; Burke, P. Nature Nanotech. 2009, 4, 811-819.
(5) Rouhi, N.; Jain, D.; Burke, P. J. ACS Nano 2011, 5, 8471-8487.
(6) Hersam, M. C. Nature Nanotech. 2008, 3, 387-394.
(7) Liu, H.; Nishide, D.; Tanaka, T.; Kataura, H. Nature Commun. 2011, 2, 309.
(8) Lee, H. W.; Yoon, Y.; Park, S.; Oh, J. H.; Hong, S.; Liyanage, L. S.; Wang, H.; Morishita, S.; Patil, N.; Park, Y. J.; Park, J. J.; Spakowitz, A.; Galli, G.; Gygi, F.; Wong, P. H.-S.; Tok, J. B.-H.; Kim, J. M.; Bao, Z. Nature Commun. 2011, 2, 541.
(9) Tulevski, G. S.; Franklin, A. D.; Afzali, A. ACS Nano 2013, 7, 2971-2976.
(10) Jin, S. H.; Dunham, S. N.; Song, J.; Xie, X.; Kim, J.; Lu, C.; Islam, A.; Du, F.; Kim, J.; Felts, J.; Li, Y.; Xiong, F.; Wahab, M. A.; Menon, M.; Cho, E.; Grosse, K. L.; Lee, D. J.; Chung, H. U.; Pop, E.; Alam, M. A.; King, W. P.; Huang, Y.; Rogers, J. A. Nature Nanotech. 2013, 8, 347-355.
(11) Park, H.; Afzali, A.; Han, S.-J.; Tulevski, G. S.; Franklin, A. D.; Tersoff, J.; Hannon, J. B.; Haensch, W. Nature Nanotech. 2012, 7, 787-791.

(12) Ding, L.; Zhang, Z.; Liang, S.; Pei, T.; Wang, S.; Li, Y.; Zhou, W.; Liu, J.; Peng, L.-M. *Nature Commun.* 2012, 3, 677.
(13) Cao, Q.; Han, S.-J.; Tulevski, G. S.; Zhu, Y.; Lu, D. D.; Haensch, W. *Nature Nanotech.* 2013, 8, 180-186.
(14) Sun, D.; Timmermans, M. Y.; Tian, Y.; Nasibulin, A. G.; Kauppinen, E. I.; Kishimoto, S.; Mizutani, T.; Ohno, Y. *Nature Nanotech.* 2011, 6, 156-161.
(15) Takahashi, T.; Takei, K.; Gillies, A. G.; Fearing, R. S.; Javey, A. *Nano Lett.* 2011, 11, 5408-5413.
(16) Wang, C.; Chien, J.-C.; Takei, K.; Takahashi, T.; Nah, J.; Niknejad, A. M.; Javey, A. *Nano Lett.* 2012, 12, 1527-1533.
(17) Sangwan, V. K.; Ortiz, R. P.; Alaboson, J. M. P.; Emery, J. D.; Bedzyk, M. J.; Lauhon, L. J.; Marks, T. J.; Hersam, M. C. *ACS Nano* 2012, 6, 7480-7488.
(18) Shi, J.; Guo, C. X.; Chan-Park, M. B.; Li, C. M. *Adv. Mater.* 2012, 24, 358-361.
(19) Chae, S. H.; Yu, W. J.; Bae, J. J.; Duong, D. L.; Perello, D.; Jeong, H. Y.; Ta, Q. H.; Ly, T. H.; Vu, Q. A.; Yun, M.; Duan, X.; Lee, Y. H. *Nature Mater.* 2013, 12, 403-409.
(20) Chen, P.; Fu, Y.; Aminirad, R.; Wang, C.; Zhang, J.; Wang, K. L.; Galatsis, K.; Zhou, C. *Nano Lett.* 2011, 11, 5301-5308.
(21) Ha, M.; Xia, Y.; Green, A. A.; Zhang, W.; Renn, M. J.; Kim, C. H.; Hersam, M. C.; Frisbie, C. D. *ACS Nano* 2010, 4, 4388-4395.
(22) Bisri, S. Z.; Gao, J.; Derenskyi, V.; Gomulya, W.; Iezhokin, I.; Gordiichuk, P.; Herrmann, A.; Loi, M. A. *Adv. Mater.* 2012, 24, 6147-6152.
(23) Ha, M.; Seo, J. T.; Prabhumirashi, P. L.; Zhang, W.; Geier, M. L.; Renn, M. J.; Kim, C. H.; Hersam, M. C.; Frisbie, C. D. *Nano Lett.* 2013, 13, 954-960.
(24) Cao, Q.; Kim, H.; Pimparkar, N.; Kulkarni, J. P.; Wang, C.; Shim, M.; Roy, K.; Alam, M. A.; Rogers, J. A. *Nature* 2008, 454, 495-500.
(25) Lee, S. Y.; Lee, S. W.; Kim, S. M.; Yu, W. J.; Jo, Y. W.; Lee, Y. H. *ACS Nano* 2011, 5, 2369-2375.
(26) Zhang, J.; Wang, C.; Fu, Y.; Che, Y.; Zhou, C. *ACS Nano* 2011, 5, 3284-3292.
(27) Wang, C.; Ryu, K.; Badmaev, A.; Zhang, J.; Zhou, C. *ACS Nano* 2011, 5, 1147-1153
(28) Weste, N. H. W.; Harris, D. M. *CMOS VLSI Design: A Circuits and Systems Perspective*; Addison-Wesley: Boston, 2006.
(29) Kim, S. M.; Jang, J. H.; Kim, K. K.; Park, H. K.; Bae, J. J.; Yu, W. J.; Lee, I. H.; Kim, G.; Loc, D. D.; Kim, U. J.; Lee, E.-H.; Shin, H.-J.; Choi, J.-Y.; Lee, Y. H. *J. Am. Chem. Soc.* 2009, 131, 327-331.

What is claimed is:

1. A method of fabricating a complementary metal-oxide-semiconductor (CMOS) logic device with single-walled carbon nanotubes (SWCNTs), comprising:
    forming a plurality of local metallic gate structures on a substrate by depositing a metal on the substrate;
    forming a plurality of contacts on the substrate;
    depositing the SWCNTs on the substrate, and doping a certain area of the SWCNTs to form the CMOS logic device having at least one n-type metal-oxide-semiconductor (NMOS) transistor and at least one p-type metal-oxide semiconductor (PMOS) transistor, wherein each of the at least one NMOS transistor and each of the at least one PMOS transistor has a gate formed by one of the local metallic gate structures, and a source and a drain formed by two of the contacts respectively;
    depositing a first encapsulation layer on the substrate to cover the at least one PMOS transistor and the at least one NMOS transistor, wherein the first encapsulation layer is formed by a photoresist;
    removing a part of the first encapsulation layer to expose the at least one NMOS transistor, such that remaining first encapsulation layer covers the at least one PMOS transistor; and
    coating a second encapsulation layer to cover the exposed at least one NMOS transistor and the remaining first encapsulation layer, wherein the second encapsulation layer is formed by $Al_2O_3$;
    wherein the gate of each of the at least one PMOS transistor and the gate of each of the at least one NMOS transistor is configured to alternatively receive at least one input voltage; and
    wherein at least one of the drain of the at least one PMOS transistor and the drain of the at least one NMOS transistor is configured to output an output voltage $V_{out}$.

2. The method of claim 1, wherein each of the at least one PMOS transistor and each of the at least one NMOS transistor is a thin-film transistor (TFT).

3. The method of claim 1, wherein the metal of each of the local metal gate structures is nickel (Ni).

4. The method of claim 3, further comprising:
    depositing a layer of $Al_2O_3$ over the substrate to cover the Ni of each of the local metal gate structures.

5. The method of claim 1, wherein said forming the plurality of contacts on the substrate comprises:
    patterning the plurality of contacts on the substrate by photolithography.

6. A method of fabricating a complementary metal-oxide-semiconductor (CMOS) logic device with single-walled carbon nanotubes (SWCNTs), comprising:
    forming a plurality of local metallic gate structures on a substrate by depositing a metal on the substrate;
    forming a plurality of contacts on the substrate; and
    depositing the SWCNTs on the substrate, and doping a certain area of the SWCNTs to form the CMOS logic device having at least one n-type metal-oxide-semiconductor (NMOS) transistor and at least one p-type metal-oxide semiconductor (PMOS) transistor, wherein each of the at least one NMOS transistor and each of the at least one PMOS transistor has a gate formed by one of the local metallic gate structures, and a source and a drain formed by two of the contacts respectively;
    wherein the gate of each of the at least one PMOS transistor and the gate of each of the at least one NMOS transistor is configured to alternatively receive at least one input voltage; and
    wherein at least one of the drain of the at least one PMOS transistor and the drain of the at least one NMOS transistor is configured to output an output voltage Vout; wherein said depositing the SWCNTs on the substrate comprises:
    depositing the SWCNTs on a membrane;
    stamping the membrane with the SWCNTs on the substrate; and
    submerging the substrate with the membrane and the SWCNTs thereon in a solvent to dissolve the membrane.

7. The method of claim 6, wherein the solvent is acetone.

8. The method of claim 6, wherein said depositing the SWCNTs on the substrate further comprises:
    covering a plurality of channel areas of the SWCNTs on the substrate with a photoresist; and
    etching the SWCNTs outside at least one of the channel areas by reactive ion etching.

9. A method of fabricating a complementary metal-oxide-semiconductor (CMOS) logic device with single-walled carbon nanotubes (SWCNTs), comprising:
forming a plurality of local metallic gate structures on a substrate by depositing a metal on the substrate;
forming a plurality of contacts on the substrate; and
depositing the SWCNTs on the substrate, and doping a certain area of the SWCNTs to form the CMOS logic device having at least one n-type metal-oxide-semiconductor (NMOS) transistor and at least one p-type metal-oxide semiconductor (PMOS) transistor, wherein each of the at least one NMOS transistor and each of the at least one PMOS transistor has a gate formed by one of the local metallic gate structures, and a source and a drain formed by two of the contacts respectively;
wherein the gate of each of the at least one PMOS transistor and the gate of each of the at least one NMOS transistor is configured to alternatively receive at least one input voltage; and
wherein at least one of the drain of the at least one PMOS transistor and the drain of the at least one NMOS transistor is configured to output an output voltage Vout;
wherein said doping the certain area of the SWCNTs comprises:
annealing the substrate in vacuum at an annealing temperature for a period of time; and depositing a benzyl viologen solution onto the certain area of the SWCNTs to form the at least one NMOS transistor.

10. The method of claim 9, wherein the annealing temperature is about 200° C., and the period of time is about 1 hour.

11. The method of claim 6, wherein the CMOS logic device is a logic inverter.

12. The method of claim 11, wherein
the at least one PMOS transistor comprises a first PMOS thin-film transistor (TFT);
the at least one NMOS transistor comprises a first NMOS TFT;
the at least one input voltage comprises a common input voltage $V_{IN}$;
the gate of the first PMOS TFT and the gate of the first NMOS TFT are respectively electrically connected to a common input voltage line for alternatively receiving the common input voltage $V_{IN}$;
the drain of the first PMOS TFT and the drain of the first NMOS TFT are respectively electrically connected to a common output voltage line for alternatively outputting the output voltage $V_{OUT}$;
the source of the first PMOS TFT is connected to a power supply $V_{DD}$; and
the source of the first NMOS TFT is connected to ground.

13. The method of claim 12, wherein the CMOS logic device a low noise margin (NM) of about 0.32 $V_{DD}$, and a high NM of about 0.54 $V_{DD}$.

14. The method of claim 6, wherein the CMOS logic device is a logic NAND gate.

15. The method of claim 14, wherein
the at least one PMOS transistor comprises a first PMOS thin-film transistor (TFT) and a second PMOS TFT;
the at least one NMOS transistor comprises a first NMOS TFT and a second NMOS TFT;
the at least one input voltage comprises a first input voltage $V_A$ and a second input voltage $V_B$;
the gate of the first PMOS TFT and the gate of the first NMOS TFT are respectively electrically connected to a first common input voltage line for alternatively receiving the first input voltage $V_A$;
the gate of the second PMOS TFT and the gate of the second NMOS TFT are respectively electrically connected to a second common input voltage line for alternatively receiving the second input voltage $V_B$;
the drain of the first PMOS TFT, the drain of the second PMOS TFT, and the drain of the first NMOS TFT are respectively electrically connected to a common output voltage line for outputting the output voltage $V_{OUT}$;
the source of the first PMOS TFT and the source of the second PMOS TFT are respectively electrically connected to a power supply $V_{DD}$;
the source of the first NMOS TFT is electrically connected to the drain of the second NMOS TFT; and
the source of the second NMOS TFT is electrically connected to ground.

16. The method of claim 6, wherein the CMOS logic device is a logic NOR gate.

17. The method of claim 16, wherein
the at least one PMOS transistor comprises a first PMOS thin-film transistor (TFT) and a second PMOS TFT;
the at least one NMOS transistor comprises a first NMOS TFT and a second NMOS TFT;
the at least one input voltage comprises a first input voltage $V_A$ and a second input voltage $V_B$;
the gate of the first PMOS TFT and the gate of the first NMOS TFT are respectively electrically connected to a first common input voltage line for alternatively receiving the first input voltage $V_A$;
the gate of the second PMOS TFT and the gate of the second NMOS TFT are respectively electrically connected to a second common input voltage line for alternatively receiving the second input voltage $V_B$;
the drain of the first PMOS TFT, the drain of the first NMOS TFT, and the drain of the second NMOS TFT are respectively electrically connected to a common output voltage line for outputting the output voltage $V_{OUT}$;
the source of the second PMOS TFT is electrically connected to a power supply $V_{DD}$;
the source of the first PMOS TFT is electrically connected to the drain of the second PMOS TFT; and
the source of the first NMOS TFT and the source of the second NMOS TFT are respectively electrically connected to ground.

18. A complementary metal-oxide-semiconductor (CMOS) logic device formed by the method of claim 1.

* * * * *